United States Patent
Konuma

(10) Patent No.: US 6,905,907 B2
(45) Date of Patent: Jun. 14, 2005

(54) LIGHT EMITTING DEVICE AND MANUFACTURING METHOD THEREOF

(75) Inventor: Toshimitsu Konuma, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 10/238,218

(22) Filed: Sep. 10, 2002

(65) Prior Publication Data

US 2003/0047730 A1 Mar. 13, 2003

(30) Foreign Application Priority Data

Sep. 10, 2001 (JP) ........................................ 2001-274037

(51) Int. Cl.⁷ .............................................. H01L 51/40
(52) U.S. Cl. ..................... 438/99; 438/149; 438/154; 438/155; 438/424; 438/482; 438/488
(58) Field of Search ................................ 438/149–166, 438/424–432, 479–490

(56) References Cited

U.S. PATENT DOCUMENTS

| | | |
|---|---|---|
| 5,117,299 A | 5/1992 | Kondo et al. |
| 5,132,676 A | 7/1992 | Kimura et al. |
| 5,240,801 A | 8/1993 | Hayashi et al. |
| 5,330,616 A | 7/1994 | Yamazaki |
| 5,550,066 A | 8/1996 | Tang et al. ............... 437/40 |
| 5,583,369 A | 12/1996 | Yamazaki et al. |
| 5,592,318 A | 1/1997 | Majima et al. |
| 5,652,667 A | 7/1997 | Kurogane |
| 5,670,792 A | 9/1997 | Utsugi et al. ............... 257/59 |
| 5,706,067 A | 1/1998 | Colgan et al. |
| 5,714,968 A | 2/1998 | Ikeda ........................... 345/77 |
| 5,739,890 A | 4/1998 | Uda et al. |
| 5,754,263 A | 5/1998 | Akiyama et al. |

(Continued)

FOREIGN PATENT DOCUMENTS

| | | |
|---|---|---|
| JP | 6-325869 | 11/1994 |
| JP | 7-111341 | 4/1995 |
| JP | 7-153576 | 6/1995 |
| JP | 8-054836 | 2/1996 |
| JP | 8-241047 | 9/1996 |
| JP | 10-189252 | 7/1998 |

OTHER PUBLICATIONS

English Abstract re Japanese Patent Application No. JP 6–325869 published Nov. 25, 1994.
English Abstract re Japanese Patent Application No. JP 7–111341 published Apr. 25, 1995.
English Abstract re Japanese Patent Application No. JP 7–153576 published Jun. 16, 1995.
English Abstract re Japanese Patent Application No. JP 8–054836 published Feb. 27, 1996.
English Abstract re Japanese Patent Application No. JP 8–241047 published Sep. 17, 1996.
English Abstract re Japanese Patent Application No. JP 10–189252 published Jul. 21, 1998.

*Primary Examiner*—Hoai Pham
*Assistant Examiner*—Wai-Sing Louie
(74) *Attorney, Agent, or Firm*—Cook, Alex, McFarron, Manzo, Cummings & Mehler, Ltd.

(57) ABSTRACT

An element structure is provided in which film formation irregularities and deterioration of an organic compound layer formed on an electrode are prevented in an active matrix light emitting device. After forming an insulating film so as to cover edge portions of a conductor which becomes a light emitting element electrode, polishing is performed using a CMP (chemical mechanical polishing) method in the present invention, thus forming a structure in which surfaces of a first electrode and a leveled insulating layer are coplanar. The film formation irregularities in the organic compound layer formed on the electrode can thus be prevented, and electric field concentration from the edge portions of the electrode can be prevented.

16 Claims, 14 Drawing Sheets

U.S. PATENT DOCUMENTS

| | | |
|---|---|---|
| 5,757,054 A | 5/1998 | Miyawaki et al. |
| 5,767,827 A | 6/1998 | Kobayashi et al. |
| 5,817,431 A * | 10/1998 | Shi et al. ............... 428/690 |
| 5,910,271 A | 6/1999 | Ohe et al. |
| 5,933,204 A | 8/1999 | Fukumoto |
| 5,940,053 A | 8/1999 | Ikeda ..................... 345/77 |
| 5,946,561 A | 8/1999 | Yamazaki et al. |
| 5,949,107 A | 9/1999 | Zhang |
| 6,008,876 A | 12/1999 | Moore |
| 6,011,529 A | 1/2000 | Ikeda ..................... 345/77 |
| 6,037,197 A | 3/2000 | Yamazaki et al. ........ 438/151 |
| 6,049,132 A | 4/2000 | Iwahashi et al. |
| 6,163,055 A | 12/2000 | Hirakata et al. ......... 257/347 |
| 6,294,815 B1 | 9/2001 | Yamazaki et al. ........ 257/350 |
| 6,326,249 B1 | 12/2001 | Yamazaki et al. |
| 6,396,105 B1 | 5/2002 | Yamazaki et al. ........ 257/350 |
| 6,468,844 B1 | 10/2002 | Yamazaki et al. |
| 6,538,390 B2 * | 3/2003 | Fujita et al. ............ 315/169.3 |

* cited by examiner

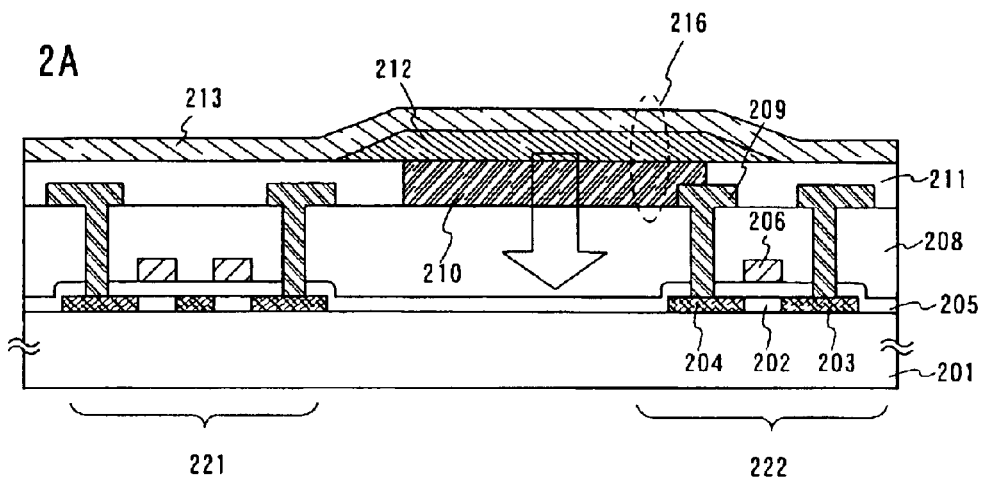
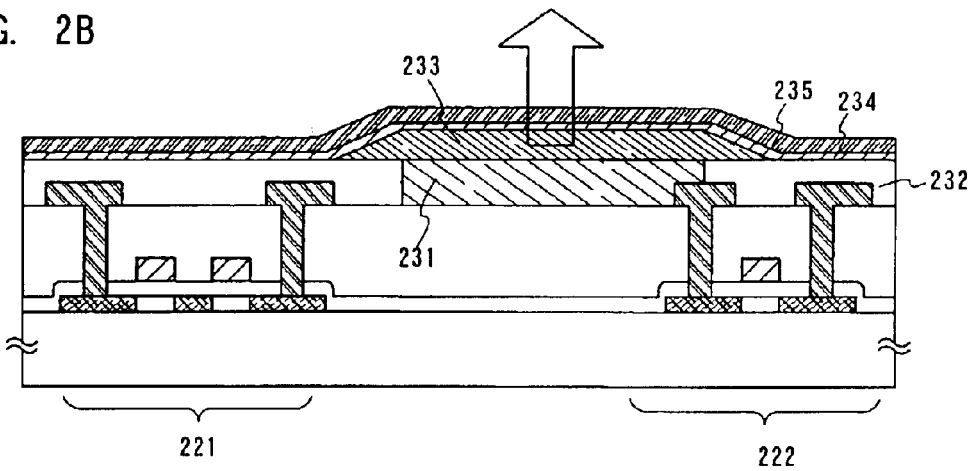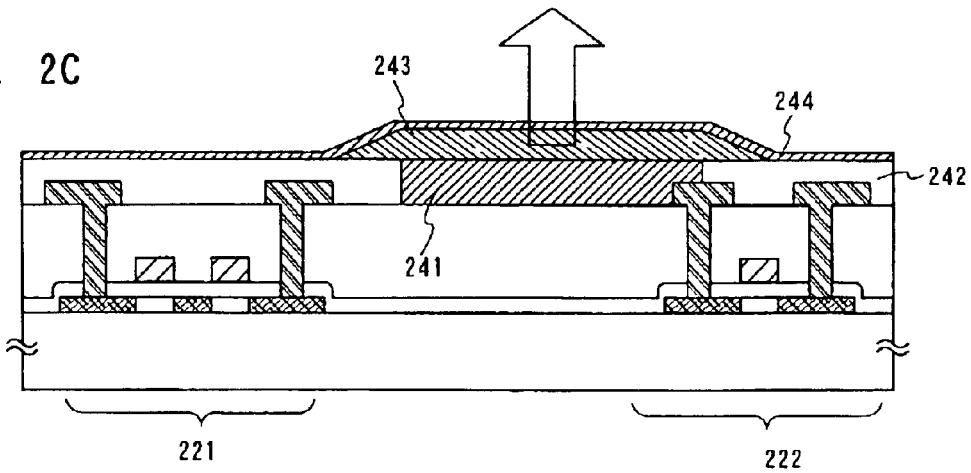

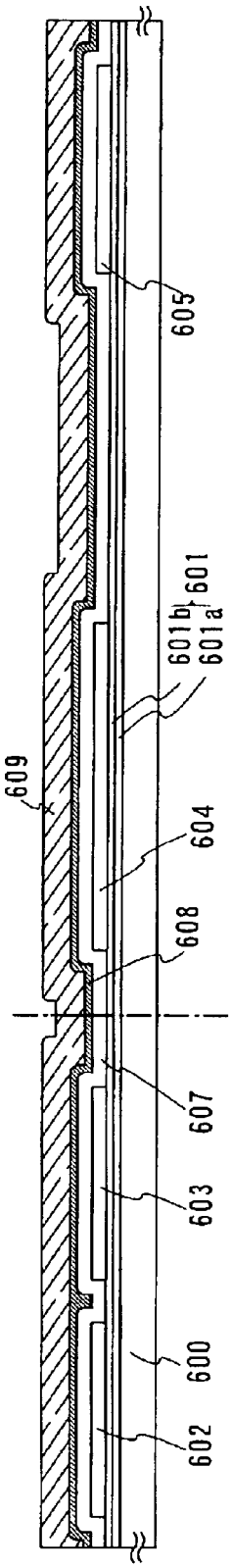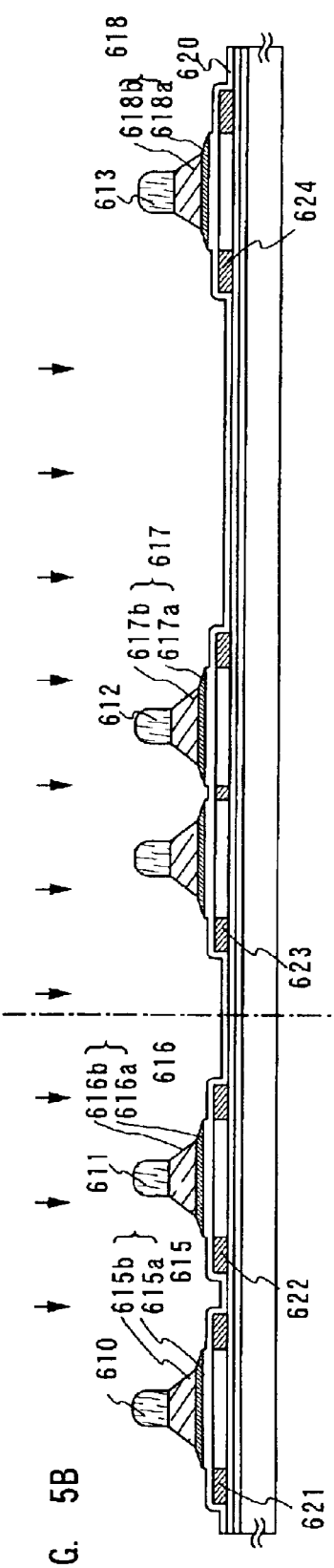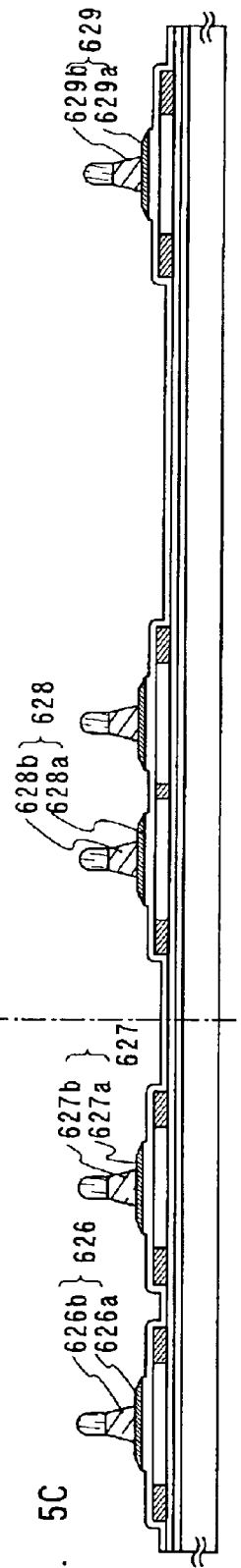

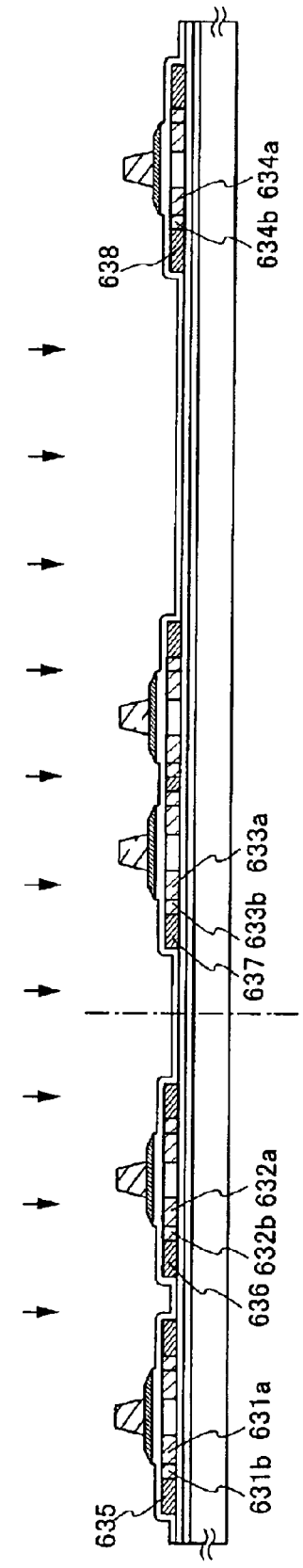
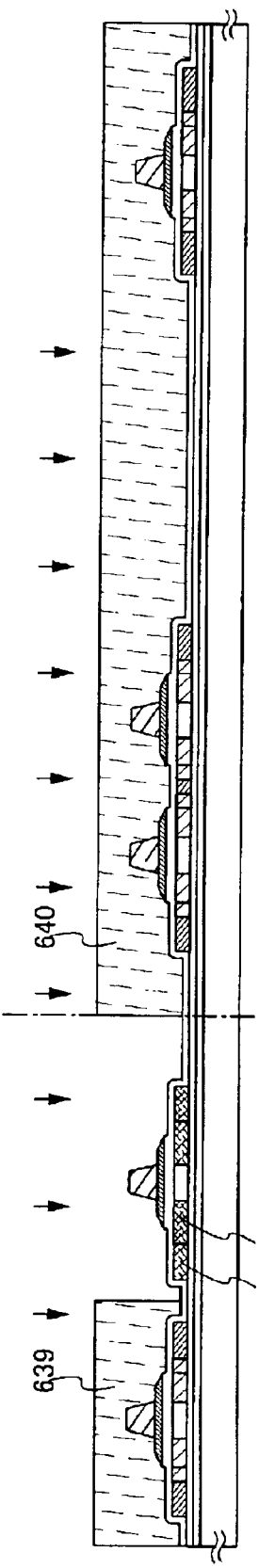
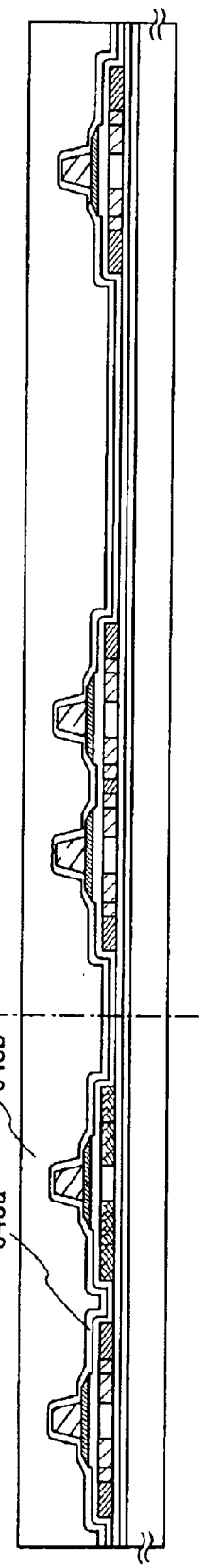
FIG. 6A
FIG. 6B
FIG. 6C

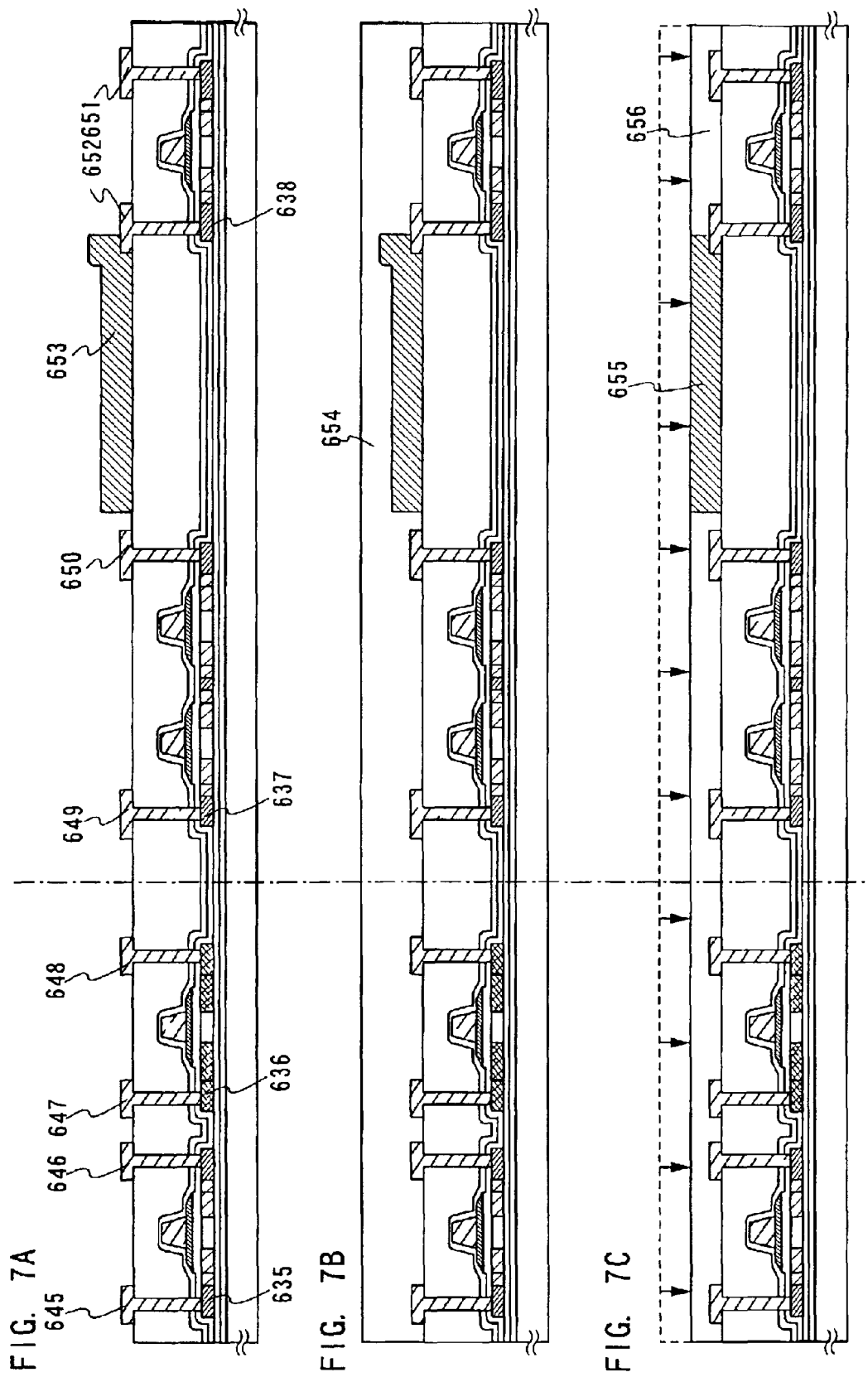

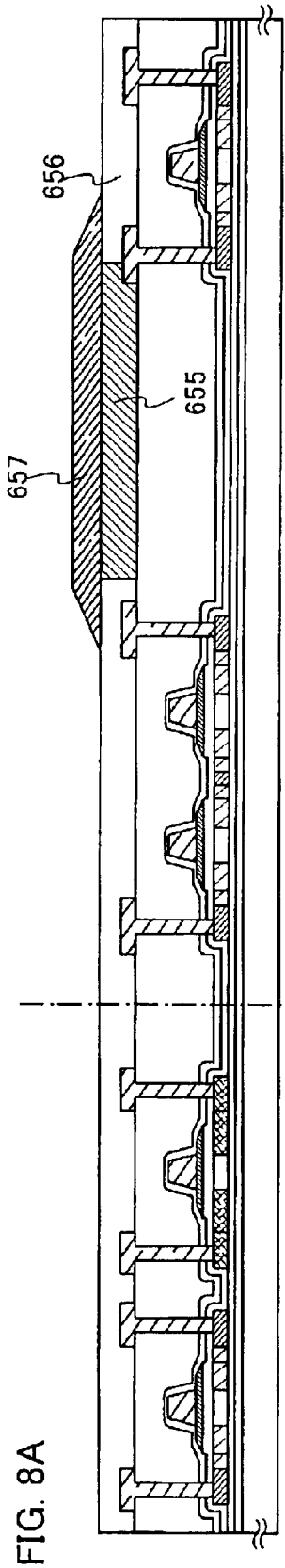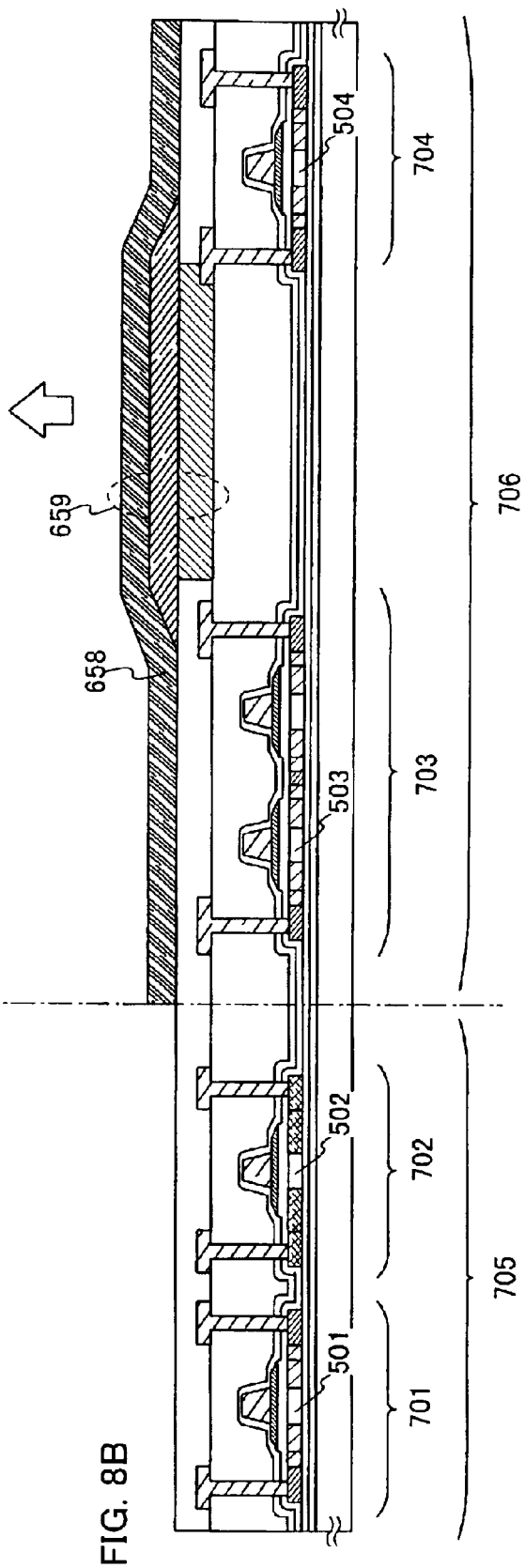
FIG. 8A
FIG. 8B

LIGHT EMITTING DEVICE AND MANUFACTURING METHOD THEREOF

BACKGROUND OF THE INVENTION

1. Field of the Invention

The present invention relates to a light emitting device with a light emitting element that emits fluorescent light or phosphorescent light upon application of electric field to a pair of electrodes of the element which sandwich a film containing an organic compound (the film is hereinafter referred to as organic to compound layer), and to a method of manufacturing the light emitting device. Incidentally, in the present specification, the light emitting device indicates an image display device or a plane emission device using a light emitting element as a light emitting element. Besides, the light emitting device includes a module in which a FPC (Flexible Printed Circuit), a TAB (Tape Automated Bonding) tape, or a TCP (Tape Carrier Package) is attached to a substrate over which a light emitting element is formed, a module in which a printed wiring board is provided at an end of a TAB tape or a TCP, and a module in which an IC (Integrated Circuit) is directly mounted on a substrate over which a light emitting element is formed by a COG (Chip On Glass) system.

2. Description of the Related Art

Light emitting elements, which employ organic compounds as light emitting member and are characterized by their thinness and light weight, fast response, and direct current low voltage driving, are expected to develop into next-generation flat panel displays. Among display devices, ones having light emitting elements arranged to form a matrix shape are considered to be particularly superior to the conventional liquid crystal display devices for their wide viewing angle and excellent visibility.

It is said that light emitting elements emit light through the following mechanism: a voltage is applied between a pair of electrodes that sandwich an organic compound layer, electrons injected from the cathode and holes injected from the anode are re-combined at the luminescent center of the organic compound layer to form molecular excitons, and the molecular excitons return to the base state while releasing energy to cause the light emitting element to emit light. Known as excitation states are singlet excitation and triplet excitation, and it is considered that luminescence can be conducted through either one of those excitation states.

Such light emitting devices having light emitting elements arranged to form a matrix can employ passive matrix driving (simple matrix light emitting devices), active matrix driving (active matrix light emitting devices), or other driving methods. However, if the pixel density is large, active matrix light emitting devices in which each pixel (or each dot) has a switch are considered as advantageous because they can be driven with low voltage.

An active matrix type light emitting device structured by that a thin film transistor (hereinafter, referred to as TFT) is formed on the insulating surface, an interlayer insulating film is formed thereon, and that the first electrode of a light emitting element connected electrically to the TFT through the interlayer insulating film.

In addition, an organic compound layer is formed on the first electrode. The organic compound layer includes a hole injection layer, a hole transporting layer, a light emitting layer, a blocking layer, an electronic transporting layer, and an electronic injection layer. The organic compound layer can be formed by a single layer, however, it can also be formed by combining above-mentioned plural layers. A light emitting element is formed by that the second electrode is formed after that the organic compound layer is formed.

When these electrodes are anodes, metals having a large work function are used as an electrode material for an improvement of hole injection from an anode to an organic compound layer. It is noted that a work function of ITO is 4.8 eV, that is made frequently use as an anode material. On the other hand, in the case that these electrodes are a cathode, small work function metals or alloy containing said metals are respectively used for an improvement of electron injection from a cathode to an organic compound layer, because a great deal of organic compound has a small electron affinity in comparison with metals or inorganic semiconductors. Typically, as metals having small work function, one is belonging Group 1 or Group 2 in periodic table of the element is preferable to be used.

In an active matrix type light emitting device, in the case that a luminescence is extracted from a light emitting element connected electrically to TFT on the substrate across the substrate, (for example, unexamined patent publication Nos. 6-325869, 7-153576, and 8-241047), it is limited to the region where the light emitting region is formed in each pixel of TFT, wiring and the like. Therefore, it produces a problem that a rate of light emitting region (an aperture ratio) having a place in the pixel region become small.

In order to solve the problem, in the case that light generated from a light emitting element is emitted from a face opposed to the substrate where the light emitting element is formed thereon (hereinafter, referred to as an upward emission), for example, it is disclosed in unexamined patent publication Nos. 7-111341, 8-54836, and 10-189252, problems due to an aperture ratio can be prevented.

However, in any case of above-mentioned structures, the first electrode electrically connected to a TFT is formed on the interlayer insulating film covering TFT, so that the face has irregularities. At this time, an organic compound layer of a light emitting element with a thickness of 20 to 200 nm formed on an electrode is so thin that make a difference in level when an electrode is formed, and that result to produce a defective deposition in the organic compound layer formed on the difference level. The portion of a defective deposition is cause to short-circuit between the first electrode forming a light emitting element and the second electrode formed on the organic compound layer. Therefore, there are some cases that the method structured by that the edge portion of the first electrode is covered by an insulating film is adopted.

In addition, in the forming step of the second electrode, in the particular case that the light is emitted from the second electrode side, the thickness should be thin not to deteriorate the transmittance. Similarly, a level difference due to the first electrode may be a cause of deposition deterioration in forming of the second electrode.

A transparent conductive film needs to be formed above the organic compound layer in order to emit light from opposite face to the substrate. However, a problem is occurred that necessity of high energy to form the film is severely damage the organic compound layer.

SUMMARY OF THE INVENTION

The object of the present-invention is to prevent a deterioration of a film deposition of an organic compound layer formed on an electrode by forming the structure that seldom has a difference of level between an electrode formed face and an electrode when an electrode is formed in manufacturing step of a light emitting device. Further, a structure in which concentration of electrical field is never occurred is manufactured thereby enabling to provide a long-living light emitting device in which the light emitting element is hardly deteriorated.

There is a danger that an electric field concentration may occur from an edge portion of a first electrode, and an organic compound layer formed on the first electrode may deteriorate, and there is a danger that film formation irregularities may develop when forming the organic compound layer due to roughness formed when there is a step in the edge portion of the first electrode, and when the edge portion of the first electrode is covered by an insulating film. The applicant of the present invention therefore considers forming an insulating layer that contacts the edge portion of the first electrode and is coplanar with a surface of the first electrode.

The applicant of the present invention also considers polishing by using CMP (chemical mechanical polishing) after forming the insulating film so as to cover the edge portion of a conductor that becomes the first electrode, and forming the first electrode and a leveled insulating layer on the same plane.

CMP is a method in which a surface of a workpiece to be polished is taken as a standard, and leveling is performed chemically or mechanically on the surface by following the standard. Generally, a polishing cloth or a polishing pad (hereinafter referred to generically as "pad" in this specification) is attached to a platen or a polishing plate. The platen and the workpiece to be polished are then each rotated or oscillated, while supplying slurry between the workpiece and the pad. Polishing of the surface is thus performed by a compound chemical and mechanical action.

The first electrode and the leveled insulating layer can be formed on the same plane, and deterioration and film forming irregularities that follow electric field concentration of the organic compound layer formed on the first electrode can be prevented, in accordance with the above structure. Note that a state in which a conductive film that becomes the first electrode has been patterned is referred to as a conductor within this specification, and that the conductor is referred to as the first electrode after undergoing the polishing process by the CMP method. In addition, the insulating film formed so as to cover the conductor is referred to as the leveled insulating layer after undergoing polishing process by the CMP method.

Further, in addition to the aforementioned structure, not only can an element structure be formed in which light emission developing in the organic compound layer is emitted toward the substrate from the first gate electrode side of the light emitting element, but it also becomes possible to form a light emitting element, without taking into account the aperture ratio, by forming an element structure in which light is emitted in a direction opposite that of the substrate from a second electrode side formed on the organic compound layer.

Additionally, although it is necessary to form the second electrode by using a transparent conductive film having light transmitting characteristics when forming an upper surface emission structure, sputtering damage during film formation of the second electrode can be prevented by forming the second electrode using evaporation and by forming a barrier film in advance.

Furthermore, with the elements of the present invention, the second electrode can be formed without causing film forming irregularities, even if it is necessary to form a thin film due to qualities such as material transmittivity and resistivity when forming the second electrode in order to give it a flat structure.

A structure of the present invention disclosed in this specification relates to a method of manufacturing a light emitting device, characterized by comprising:

forming a thin film transistor on a substrate;

forming an insulating layer covering the thin film transistor;

forming a wiring through the insulating layer;

forming a conductor, which is electrically connected to the thin film transistor by the wiring, on the insulating layer;

forming an insulating film covering the conductor;

polishing the conductor and the insulating film by a CMP method, thus forming a first electrode and a leveled insulating layer;

forming an organic compound layer contacting the first electrode; and forming a second electrode contacting the organic compound layer;

in which the first electrode and the leveled insulating film formed by the CMP method form the same plane.

Also, another structure of the present invention disclosed in this specification relates to a method of manufacturing a light emitting device, characterized by comprising:

forming a thin film transistor on a substrate;

forming an insulating layer covering the thin film transistor;

forming a wiring through the insulating layer;

forming a conductor, which is electrically connected to the thin film transistor by the wiring, on the insulating layer;

forming an insulating film covering the conductor;

polishing the conductor and the insulating film by a CMP method, thus forming a first electrode and a leveled insulating layer;

forming an organic compound layer contacting the first electrode; and forming a second electrode contacting the organic compound layer;

in which the organic compound layer is formed so as to completely cover the first electrode.

Further, another structure of the present invention disclosed in this specification relates to a method of manufacturing a light emitting device, characterized by comprising:

forming a thin film transistor on a substrate;

forming an insulating layer covering the thin film transistor; forming a wiring through the insulating layer;

forming a conductor, which is electrically connected to the thin film transistor by the wiring, on the insulating layer;

forming an insulating film covering the conductor;

polishing the conductor and the insulating film by a CMP method, thus forming a first electrode and a leveled insulating layer;

forming an organic compound layer contacting the first electrode; and forming a second electrode contacting the organic compound layer;

in which the organic compound layer is formed contacting the first electrode and the leveled insulating layer.

In each of the above structures, the method is characterized in that the first electrode and the leveled insulating film formed by polishing by a CMP method have a film thickness of from 50 to 500 nm.

Further, a structure of the present invention disclosed in this specification relates to a light emitting device including:
a first electrode having an edge portion;
a leveled insulating film formed contacting the edge portion of the first electrode;
an organic compound layer; and
a second electrode;
characterized in that:
surfaces of the first electrode and the leveled insulating layer are coplanar;
the organic compound layer contacts the first electrode; and
the second electrode contacts the leveled insulating layer and the organic compound layer.

Further, another structure of the present invention disclosed in this specification relates to a light emitting device including:
a thin film transistor;
a wiring;
a first electrode having an edge portion;
a leveled insulating layer formed contacting the edge portion of the first electrode;
an organic compound layer; and
a second electrode;
formed on a substrate;
characterized in that:
the first electrode is electrically connected to the thin film transistor through the wiring;
surfaces of the first electrode and the leveled insulating layer are coplanar;
the organic compound layer contacts the first electrode; and
the second electrode contacts the leveled insulating layer and the organic compound layer.

In each of the above structures, the thin film transistor is a p-channel thin film transistor in the case where the first electrode is an anode. Further, the thin film transistor is an n-channel type thin film transistor in the case where the first electrode is a cathode.

Furthermore, it is preferable that a material having a large work function be used as a material for forming the first electrode in the case where the first electrode is the anode. This is because holes are injected into the organic compound layer from the anode when a voltage is applied, and therefore it is necessary that the first electrode material have an HOMO level which is higher than that of the organic compound forming the organic compound layer. Note that it is preferable that the first electrode be formed of a low resistance material, because it is formed while being connected to a TFT. Materials such as ITO (indium tin oxide) and IZO (indium zinc oxide), which are transparent conductive films, and platinum (Pt), chrome (Cr), tungsten (W), and nickel (Ni) can be used as the specific anode materials which satisfy these conditions.

Conversely, it is preferable that a material having a small work function be used in cases in which the first electrode is the cathode. This is because an electrode having a small work function is necessary for electron injection because the electron affinity of many organic materials is small compared to metals and inorganic semiconductors. Further, it is preferable that a low resistance material be used for the first electrode, because it is formed while being connected to a TFT formed on a substrate.

Metallic materials such as aluminum, titanium, and tungsten are applicable as low resistance materials, and an alloy in which a material belonging in Group 1 or Group 2 of the periodic table is laminated with these low resistance materials may be used because a small work function is required in order to be used as the cathode material. In addition, it is also possible to use a chemical compound such as a fluoride of a material belonging in Group 1 or Group 2 of the periodic table.

Specifically, there are alloys such as: an alloy in which silver is added to magnesium (Mg:Ag), an alloy in which lithium is added to aluminum (Al:Li), and an alloy containing lithium, calcium, and magnesium in aluminum. Note that the alloys in which lithium is added to aluminum are known to be capable of making the work function of aluminum smallest.

Further, in the present invention, after the first electrode is formed, an insulating film made from an insulating material is formed on the first electrode so as to completely cover the first electrode. By then polishing a part of the formed insulating film and the first electrode by the CMP method, a structure is formed such that the insulating film and the first electrode are formed on the same plane.

Further, in addition to insulating materials containing silicon such as silicon oxide, silicon oxynitride, and silicon nitride, organic resin films such as polyimide, polyamide, acrylic (including photosensitive acrylics) and BCB (benzocyclobutene) can also be used as the insulating material used in the insulating film.

Steps between the first electrode and the insulating film are thus eliminated, and therefore problems such as film formation irregularities arising upon forming an organic compound layer and a second electrode later can be resolved.

In addition, by performing the aforementioned processing using the CMP method, the film thickness of the organic compound layer formed on the first electrode can be made uniform because the surface of the first electrode is leveled, and an electric field can be added uniformly with respect to the organic compound layer. Note that electric current density is non-uniform in the organic compound layer in the case where the electric field is non-uniform, and not only does the luminance of a light emitting element drop, but in addition, a problem arises in that the element lifetime is reduced because the element deteriorates quickly. Processing by the CMP method therefore also has an effect of increasing the element characteristics by allowing the addition of a uniform electric field with respect to the organic compound layer.

Furthermore, the organic compound layer formed on the first electrode is a place at which carriers injected from the cathode and the anode recombine. There is a case in which the organic compound layer is formed by a single layer comprised of only a light emitting layer, but the present invention also includes a case in which a plurality of layers such as a hole injecting layer, a hole transporting layer, a light emitting layer, a blocking layer, an electron transporting layer, and an electron injecting layer are laminated and formed as the organic compound layer. Note that known materials can be used as the materials employed when forming these layers during the formation of the organic compound layer in the present invention.

BRIEF DESCRIPTION OF THE DRAWINGS

In the accompanying drawings:

FIGS. 2A to 2C are diagrams for explaining an element structure of a light emitting device of the present invention;

FIGS. 5A to 5C are diagrams for explaining a process of manufacturing the light emitting device of the present invention;

FIGS. 6A to 6C are diagrams for explaining the process of manufacturing the light emitting device of the present invention;

FIGS. 7A to 7C are diagrams for explaining the process of manufacturing the light emitting device of the present invention;

FIGS. 8A and 8B are diagrams for explaining the process of manufacturing the light emitting device of the present invention;

DETAILED DESCRIPTION OF THE PREFERRED EMBODIMENTS

FIGS. 1A to 1D and 2A to 2C are used in explaining an embodiment mode of the present invention. A light emitting device of the present invention is manufactured by a method of manufacturing containing a CMP process, explained by FIGS. 1A to 1C, as a portion. Further, FIGS. 2A to 2C show an element structure of the light emitting device manufactured by the present invention.

Figure 1A:
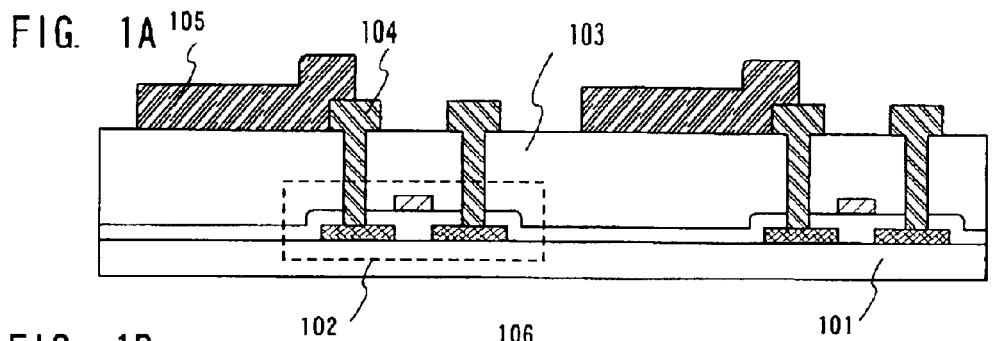
FIGS. 1A to 1D are diagrams for explaining the structure of the present invention.

In FIG. 1A, a thin film transistor (TFT) 102 is formed on a substrate 101, and a conductor 105, which is electrically connected to the thin film transistor 102 is by a wiring 104 formed through an insulating layer 103, is formed.

Figure 1B:
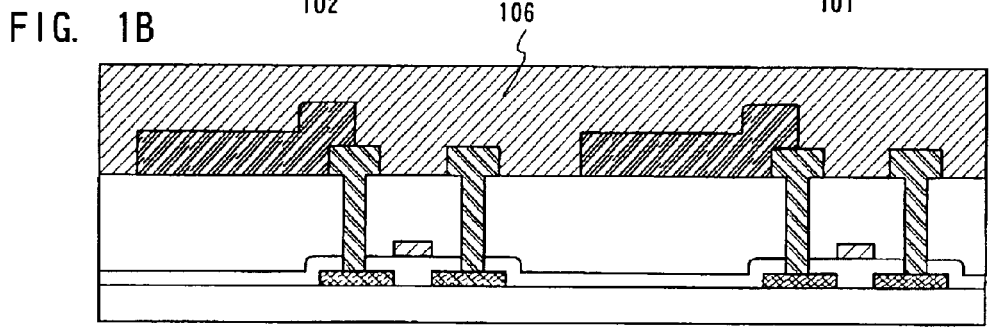

An insulating film 106 made from an insulating material is formed next on the conductor 105 so as to cover the conductor 105 as shown in FIG. 1B. Note that the insulating film 106 formed here is formed so as to be thicker than the film thickness obtained when forming the conductor 105 and the wiring 104. Specifically, the insulating film 106 is formed to have a thickness of 0.5 to 5 $\mu$m. The conductor 105 and the wiring 104 are thus completely covered by the insulating film 106.

Figure 1C:
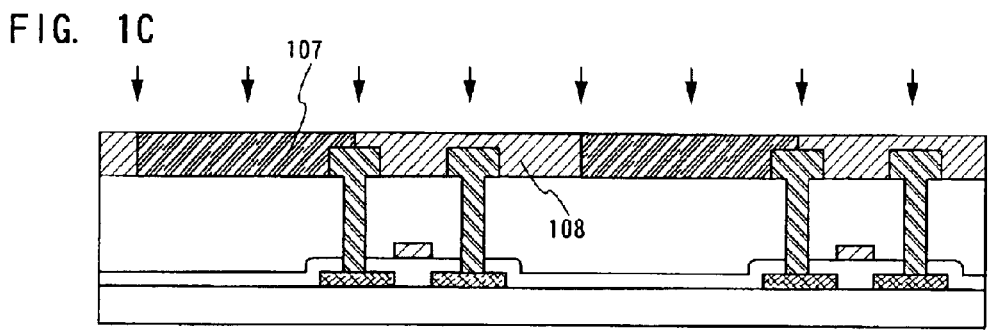

The insulating film 106 and the conductor 105 are then polished by the CMP method as shown in FIG. 1C. Note that FIG. 1D shows an apparatus for performing polishing by CMP.

Figure 1D:
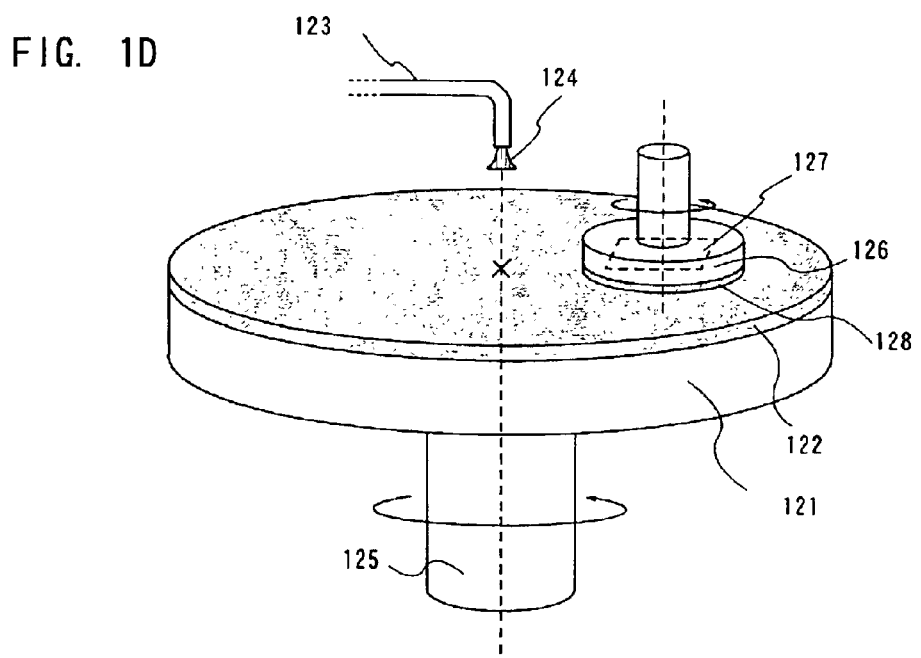

A polishing cloth (also referred to as a pad) 122 is attached to a circular shape rotational platen 121 having a diameter of 80 cm as shown in FIG. 1D. Urethane foam or the like is employed as the material used in the polishing cloth 122.

Slurry 124 is then supplied to the center of the rotational platen 122 through a pipe 123, and the slurry 124 spreads out over the entire surface of the polishing cloth 122 on the rotational platen 121 by the rotation and oscillation of the rotational platen 121. The slurry 124 is a colloid solution in which particles, a liquid, and a chemical agent are mixed. Silica slurry having a pH of 9 to 11 and made from KOH and the like, alumina ($Al_2O_3$) slurry having a pH of 3 to 4, and magnesium oxide ($MnO_2$, $Mn_2O_3$) slurry can be used for the slurry 124. The alumina slurry can be used by combining with an agent having oxidizing power. In addition, it is also possible to use neutral slurry and the like. Note that the term neutral slurry used here includes slurry formed by silica and water.

Note that the slurry shown here are only preferable examples, and other known slurry can also be used. Further, the rotational platen 121 rotates with its center as a rotational axis 125. Note that the rotational speed of the rotational platen 121 is set to be 3 to 10 rpm.

On the other hand, a glass substrate 127 adheres to a circular shape metallic polishing head 126 having a diameter of 30 cm by vacuum suction. A wafer suction pad 128 is formed between the glass substrate 127 and the polishing head 126. There are holes between the wafer suction pad 128 and the polishing head 126, and the glass substrate 127 adheres to the polishing head 126 through the holes. The center of the polishing head 126 is positioned between the center of the rotational platen 121 and the circumference of the rotational platen 121. The polishing head 126 is rotated at 10 to 50 rpm with the center of the polishing head 126 as a rotational axis.

Note that a pressure of 200 to 400 gf/cm$^2$ is applied to the glass substrate 127, pushing the glass substrate 127 onto the polishing cloth 122 on the rotational platen 121. The polishing rate of the film to be polished can be regulated by changing the pressure of the polishing head 126.

The polishing time is set to be 1 to 2 minutes. By polishing both the insulating film 106 and the conductor 105, a first electrode 107 and a leveled insulating film 108 can be formed having an equal film thickness, as measured from the surface of the insulating film 103, and can be formed on the same plane.

Note that known materials can be used for the slurry, the pad, and the like employed in the CMP method explained here. Further, known methods can be used for processing conditions and the like.

Note that the conductor 105 polished by CMP here is referred to as the first electrode 107, and the insulating film 106 polished by CMP here is referred to as the leveled insulating layer 108. The first electrode 107 and the leveled insulating layer 108 formed here have a thickness of 50 to 500 nm.

An organic compound layer (not shown) is then formed on the first electrode 107. Note that the organic compound layer is formed so as to completely cover the first electrode. In addition, a second cathode (not shown) is formed on the organic compound layer, thereby completing a light emitting element.

An active matrix light emitting device manufactured by forming the organic compound layer and the second electrode on the first electrode as discussed above is explained in detail in Embodiment Modes 1 to 3 below.

[Embodiment Mode 1]

A cross sectional structure of a pixel portion of a light emitting device formed as Embodiment Mode 1 of the present invention is shown in FIG. 2A.

Thin film transistors (TFTs) are formed on a substrate 201 in FIG. 2A. Note that there are shown here, an electric current control TFT 222 which is electrically connected to a first electrode 210 of a light emitting element 216, and which has a function for controlling electric current supplied to the light emitting element 216, and a switching TFT 221 for controlling a video signal applied to a to gate electrode of the electric current control TFT 222.

A glass substrate is used for the substrate 201 as a substrate having light transmittance here, and a quartz substrate may also be used. Further, active layer of each TFT is provided with at least a channel forming region 202, a source region 203, and a drain region 204.

Further, a gate electrode 206 is formed covering a gate insulating film 205, and overlapping with the channel forming region 202 through the gate insulating film 205, in the active layer of each TFT. Furthermore, a first insulating layer 208 is formed covering the gate electrode 206, and an electrode which is electrically connected to the source region or the drain region of each TFT is formed on the first insulating layer 208.

Note that the electric current control TFT 222 is formed by a p-channel TFT in Embodiment Mode 1, and the drain region 204 of the electric current control TFT 222 is connected to the first electrode 210. The first electrode 210 is formed so as to become an anode of the light emitting element 216. Note that the first electrode 210 is formed by a conductive material having light transmittance.

An organic compound layer 212 is formed on the first electrode 210 (anode), and a second electrode (cathode) 213 is formed on the organic compound layer 212, thereby forming a light emitting element 216.

A structure is taken in Embodiment Mode 1 in which a transparent conductive film which becomes the anode is used in the first electrode 210, and therefore light generated by carrier recombination in the organic compound layer 212 is emitted from the first electrode 210 side. Note that it is preferable that the second electrode 213 is formed by a material having light blocking property.

Note that light passing through from the first electrode 210 side passes through the substrate 201 and is released to the outside in Embodiment Mode 1. It is therefore necessary to use a material having light transmittance as the substrate 201, and specifically, glass, quartz, or plastic materials are used.

[Embodiment Mode 2]

The following describe a sectional structure of a pixel portion of a light emitting device as Embodiment Mode 2 of the present invention, referring to FIG. 2B. The structure is formed is the same as in Embodiment Mode 1 except that the current-controlling TFT 222 is formed by an n-channel type. Thus, the structure formed after that the wiring 209 is formed is described.

On the first interlayer insulating film 208 is formed a first electrode 231 connected electrically to the source region or the drain region of the current-controlling TFT 222 by the wiring 209. In Embodiment Mode 2, the first electrode 231 is formed to be a cathode.

The organic compound layer 233 is formed on the first electrode 231, therefore, it is allowable to form a barrier layer 234 by a sputtering for preventing the damage of the organic compound layer 233 when the second electrode 235 is formed. For the barrier layer 234, copper phthalocyanine (Cu-Pc), gold, platinum or the like may be used.

Further, the second electrode 235 that is made of a transparent conductive film and that is to be an anode is formed on the barrier layer 234 can be formed.

As described above, a light emitting element made of the first electrode 231, the organic compound layer 233, the barrier layer 234, and the second electrode 235.

In the present Embodiment Mode 2, by using a transparent conductive film to be an anode for the second electrode 235, light generated by recombination of carriers in the organic compound layer 233 can be emitted from the side of the second electrode 235. The structure is an upward emission structure. In the present Embodiment Mode 2, it is preferable to use a transparent material to form the first electrode 231.

[Embodiment Mode 3]

The following describe a sectional structure of a pixel portion of a light emitting device as Embodiment Mode 3 of the present invention with reference to FIG. 2C. The current-controlling TFT 222 is formed to be a p-channel type as same as in the Embodiment Mode 1. Thus, the structure formed after that the wiring 209 is formed is described.

On the first interlayer insulating film 208 is formed a first electrode 241 connected electrically to the source region or the drain region of the current-controlling TFT 222 by the wiring 209. In Embodiment Mode 3, the first electrode 241 is formed to be an anode. For forming the first electrode 241, a material having a large work function and functioning as an anode is used. Further, conductive materials having light-shielding effect and a high reflectivity are used to form the first electrode 241.

An organic compound layer 243 is deposited on the first electrode 241. A light emitting elements made of the second electrode 244 is formed thereon. In this Embodiment Mode, the second electrode 244 needs to be formed having transparency, thus, the second electrode 244 is preferably to be formed having a thickness that can transmit light (visible light).

In Embodiment Mode 3, light is generated from the organic compound layer 243 because the second electrode 244 has a transparency, and the light emits from the second electrode side 244. The structure is an upward emission structure.

In the light emitting device formed by Embodiment Modes 1 to 3, an organic compound layer of a light emitting element can be used an organic compounds as follows.

The organic compound layer is formed by a single layer or a lamination layer selected from a hole injecting layer, a hole transporting layer, an electron transporting layer, an electron injecting layer, a hole blocking layer, and a light emitting layer. These layers are made of hole injecting material, a hole transporting material, an electron transporting material, an electron injecting material, a hole blocking material, and a light emitting material. Preferable materials are described as follows. However, materials for light emitting elements of the present invention are not limited to the following.

Effective hole injecting materials are, within confines of organic compounds, porphyrin-based compounds, and phthalocyanine (hereafter, $H_2Pc$) and copper phthalocyanine (hereafter, CuPc) are often used. Among polymers, polyvinyl carbazole (hereafter, PVK) is effective as well as the aforementioned materials obtained by performing chemical doping on conductive high polymers. Examples of these high polymers include polyethylene dioxythiophene (hereafter, PEDOT) doped with polystyrene sulfonic acid (hereafter, PSS), and polyaniline, or polypyrrole, doped with iodine or other Lewis acid. A high polymer that is an insulator is also effective in terms of planarization of the anode, and polyimide (hereafter, PI) is often used. Effective materials are also found among inorganic compounds, and examples thereof include a thin film of gold, platinum or like other metals and a very thin film of aluminum oxide (hereinafter referred to alumina).

Materials most widely used as the hole transporting material are aromatic amine-based (namely, those with a benzene ring-nitrogen bond) compounds. Of them, particularly widely used are: aforementioned TPD, besides; its derivative, namely, 4,4'-bis-[N-(1-naphthyl)-N-phenyl-amino]-biphenyl (hereafter, α-NPD). Also used are star burst aromatic amine compounds, including: 4,4',4"-tris(N, N-diphenyl-amino)-triphenyl amine (hereafter, TDATA); and 4,4',4"-tris [N-(3-methylphenyl)-N-phenyl-amino]-triphenyl amine (hereafter, MTDATA).

Metal complexes are often used as the electron transporting material. Examples thereof include: metal complexes having quinoline skeleton or benzoquinoline skeleton, such as the aforementioned Alq, Iris (4-methyl-8-quinolinolate) aluminum (hereafter, Almq), and bis(10-hydroxybenzo[h]-quinolinate) beryllium (hereafter, $Bebq_2$); and bis(2-methyl-8-quinolinolate)(4-hydroxy-biphenylil)-aluminum (hereafter, BAlq) that is a mixed ligand complex. The examples also include metal complexes having oxazole-based and thiazole-based ligands such as bis[2-(2-hydroxypheyl)-benzooxazolate]zinc (hereafter, $Zn(BOX)_2$) and bis[2-(2-hydroxypheyl)-benzothiazolate]zinc (hereafter, $Zn(BTZ)_2$). Other materials that are capable of transporting electrons than the metal complexes are: oxadiazole derivatives such as 2-(4-biphenylyl)-5-(4-tert-butylphenyl)-1,3,4-oxadiazole (hereafter, PBD) and 1,3-bis[5-(p-tert-butylphenyl)-1,3,4-oxadiazole-2-il]benzene (hereafter, OXD-7); triazole derivatives such as 5-(4-biphenylyl)-3-(4-tert-butylphenyl)-4-phenyl-1,2,4-triazole (hereafter, TAZ) and 5-(4-biphenylyl)-3-(4-tert-butylphenyl)-4-(4-ethylpheyl)-1,2,4-triazole (hereafter, p-EtTAZ); and phenanthroline derivatives such as bathophenanthroline (hereafter, BPhen) and bathocupuroin (hereafter, BCP).

The electron transporting material given above can be used as the electron injecting material. Other than those, a very thin film of an insulator, including alkaline metal halides such as lithium fluoride and alkaline metal oxides such as lithium oxide, is often used. Alkaline metal complexes such as lithium acetyl acetonate (hereafter, Li(acac)) and 8-quinolinolate-lithium (hereafter, Liq) are also effective.

The following materials; BAlq, OXD-7, TAZ, p-EtTAZ, BPhen, BCP can be used as the hole blocking material. It is effective to use these materials because they have high excitation energy level.

Materials effective as the light emitting material are various fluorescent pigments, in addition to the aforementioned metal complexes including $Alq_3$, $AlmQ_3$, $BeBq_3$, BAlq, $Zn(BOX)_2$, and $Zn(BTL)_2$. Triplet light emission materials may also be used and the mainstream thereof are complexes with platinum or iridium as central metal. Known triplet light emission materials include tris(2-phenylpyridine)iridium (hereafter, $Ir(ppy)_3$) and 2,3,7,8,12,13,17,18-octaethyl-21H,23H-porphyrin-platinum (hereafter, PtOEP).

Also, although this embodiment is explained by exemplifying a top-gate TFT as a light emitting device formed by Embodiment Modes 1 to 3, the invention is not limited to a top-gate TFT, i.e. applicable to a bottom-gate TFT, forward-stagger TFT, or another TFT structure.

Embodiments

Embodiments of the present invention are explained below.

[Embodiment 1]

Detailed description will be made of light emitting devices having the element structures explained in Embodiment Mode 1, Embodiment Mode 2, and Embodiment Mode 3, respectively.

Figure 3A:
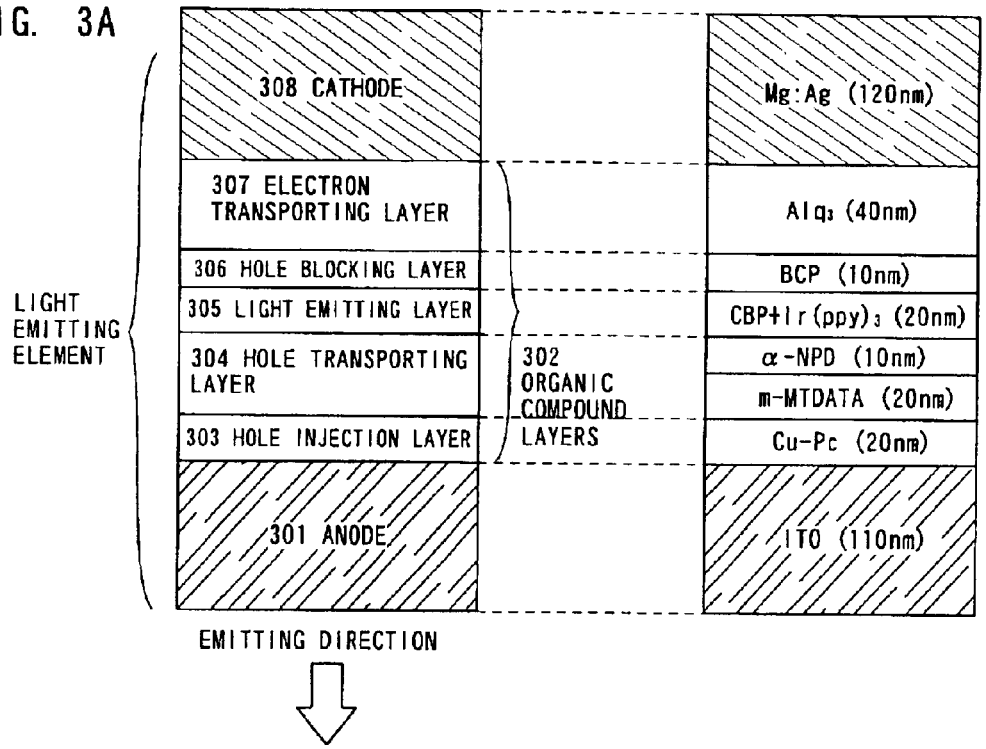
FIGS. 3A and 3B are diagrams for explaining an element structure of the light emitting device of the present invention.

FIG. 3A is a diagram showing an element structure of the light emitting device disclosed in Embodiment Mode 1. That is, the first electrode 210 which is electrically connected to the electric current control TFT 222, as shown in FIG. 2A, is an anode 301 in FIG. 3A. An organic compound layer 302 is formed on the anode 301, and a cathode 308 is formed on the organic compound layer 302. Thus, a bottom emission type element structure is employed, in which light developed in the organic compound layer 302 is emitted to the outside through the anode 301.

Note that a conductive film having a large work function and having light transmittance, such as ITO or IZO, is used as a material for forming the anode 301. The anode 301 is formed at a thickness of 110 nm by using ITO in Embodiment 1.

The organic compound layer 302 is formed next on the anode 301, and the organic compound layer 302 has a laminate structure composed of a hole injecting layer 303, a hole transporting layer 304, a light emitting layer 305, a hole blocking layer 306, and an electron transporting layer 307. Note that although a case of forming the organic compound layer 302 by using low molecular weight organic compounds is explained in Embodiment 1, it is also possible to form the organic compound layer 302 by a single layer, or a laminate, of high molecular weight organic compounds.

The hole injecting layer 303 is formed at a thickness of 20 nm using Cu-Pc in Embodiment 1, the hole transporting layer 304 is formed at a thickness of 20 nm using m-MTDATA, the light emitting layer 305 is formed at a thickness of 20 nm using CBP and $Ir(ppy)_3$, the hole blocking layer 306 is formed at a thickness of 10 nm using BCP, and the electron transporting layer 307 is formed at a thickness of 40 nm using $Alq_3$.

The cathode 308 is formed next. Note that it is preferable to use a material having light blocking property, having a high reflectivity, and having a small work function as the cathode 308 with the structure shown in FIG. 3A, and therefore an Mg:Ag alloy is used as the cathode material, and is formed at a thickness of 120 nm. Note that a laminate of an element residing in Group 1 or Group 2 of the periodic table with a conductive material such as Al, Ti, or W can also be used as the cathode material. In addition, it is also possible to use an alloy of both. The bottom emission type light emitting element disclosed in Embodiment Mode 1 can thus be obtained.

Figure 3B:
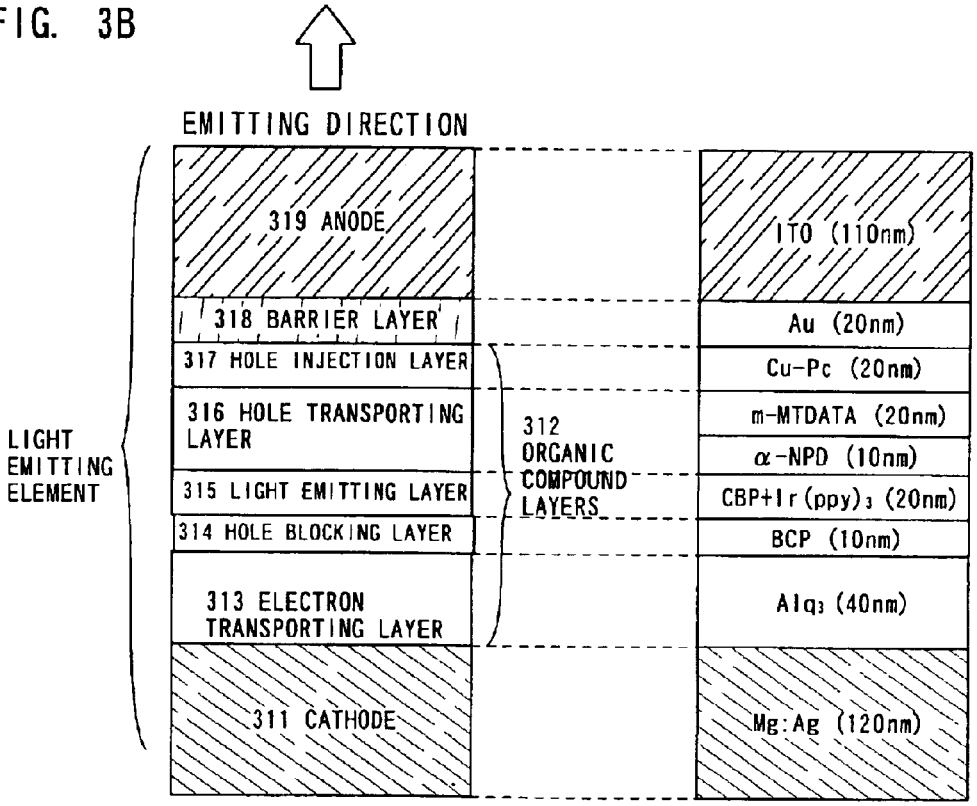

An element structure of a light emitting device disclosed in Embodiment Mode 2 is shown in FIG. 3B. That is, the first electrode 231, which is electrically connected to the electric current control TFT 222, as shown in FIG. 2B, is a cathode 311 in FIG. 3B. An organic compound layer 312 is formed on the cathode 311, and a barrier layer 318 is formed on the organic compound layer 312, and a cathode 319 is formed on the barrier layer 318. Thus, a top emission type element structure is adopted in which light developed in the organic compound layer 312 passes through the anode 319 and is emitted to the outside.

Note that, with this element structure, the anode 319 is formed on the organic compound layer 312, but the anode 319 forms ITO, a transparent conductive film by sputtering, and therefore the barrier layer 306 is formed in order to prevent damage to the organic compound layer 303 during sputtering. Note that the barrier layer 306 is mainly formed using materials formed by evaporation.

It is preferable to form the anode 311 using a material having light blocking property and having high reflectivity, and therefore the cathode 311 is formed having a thickness of 120 nm using Mg:Ag as the cathode material.

The organic compound layer 312 is formed next on the cathode 311. Materials used in forming the organic compound layer 312 are similar to those shown by FIG. 3A, but the order of lamination is reversed. An electron transporting layer 313, a hole clocking layer 314, a light emitting layer 315, a hole transporting layer 316, and a hole injecting layer 317 are laminated in order from the cathode 311 side, forming the organic compound layer 312. Note that the layers can be formed at the same thickness as used in FIG. 3A.

The barrier layer 318 is formed next on the organic compound layer 312. Note that the barrier layer 318 is formed between the organic compound layer 312 and the anode 319, and therefore in addition to materials having a large work function such as gold and silver, Cu-Pc and the like can also be used. It is necessary that the barrier layer 318 have light transmittance for the case of the structure shown in FIG. 3B because light developing in the organic compound layer 312 is emitted to the outside through the barrier layer 318 and the anode 319. In Embodiment 1, the barrier layer 318 is formed by evaporation using Au at a thickness of 20 nm, one in which the barrier layer has a transmittivity on the order capable of transmitting light. However, for the case of the structure shown in FIG. 3B, Cu-Pc may be used in the hole injecting layer 317, and Cu-Pc may be applied as the material used for forming the barrier layer, thus making the hole injecting layer 317 also function as a barrier layer. The barrier layer 318 therefore does not always need to be formed.

The cathode 319 is then formed on the barrier layer 318. Note that the cathode 319 is formed using a conductive film having light transmittance and having a large work function, such as ITO or IZO. The anode 319 is formed from ITO at a thickness of 110 nm in Embodiment 1. The bottom emission type light emitting element disclosed in Embodiment Mode 2 can thus be obtained.

Figure 4:
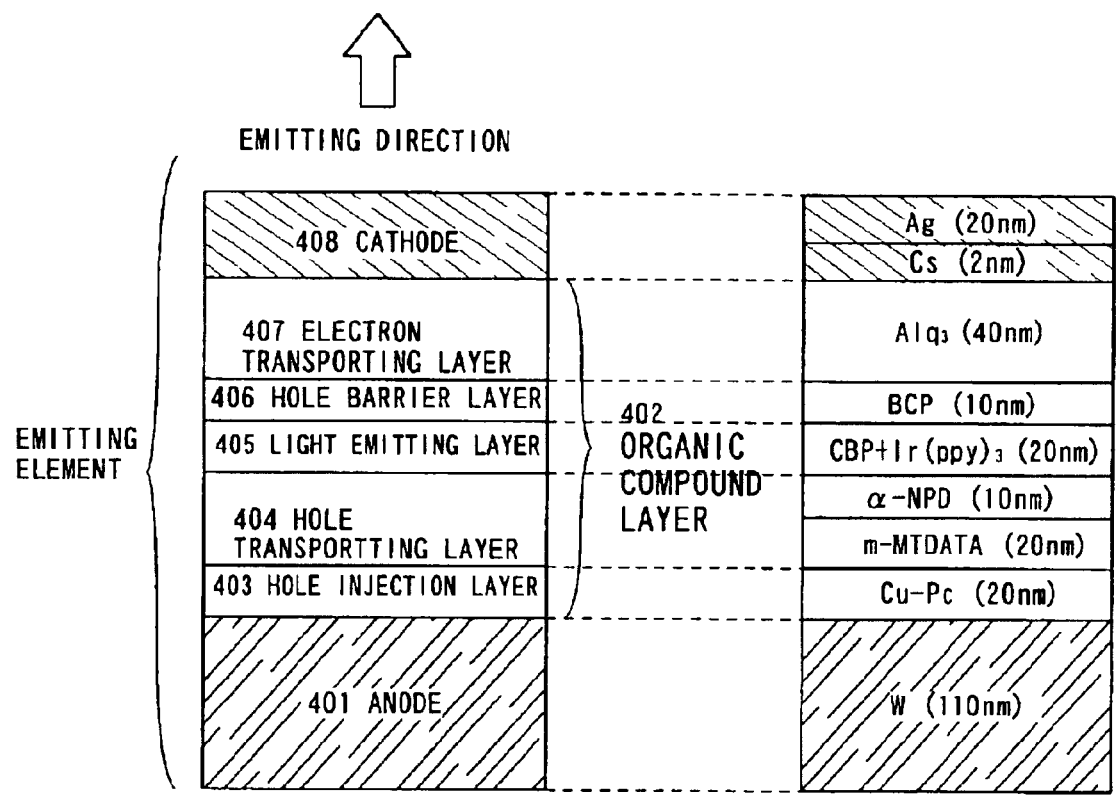
FIG. 4 is a diagram for explaining an element structure of the light emitting device of the present invention.

An element structure of a light emitting device disclosed in Embodiment Mode 3 is shown in FIG. 4. That is, the first electrode 241, which is electrically connected to the electric current control TFT 222, as shown in FIG. 2C, is an anode 401 of FIG. 4. An organic compound layer 402 is formed on the anode 401, and a cathode 408 is formed on the organic compound layer 402. Light developed in the organic compound layer 402 passes through the cathode 408 and is emitted to the outside, thus forming a top emission type element structure.

Note that a material having light blocking property, having high reflectivity, and having a large work function is used as the material for forming the anode 401. The anode 401 is formed at a thickness of 110 nm using tungsten (W) in Embodiment 1.

The organic compound layer 402 is formed next on the anode 401. The organic compound layer 402 is laminated and formed using materials similar to that shown by FIG. 3A, and at the similar film thickness.

The cathode 408 is formed next on the organic compound layer 402. Note that it is preferable to use a material having light transmittance and having a small work function for the cathode 408 with the structure shown in FIG. 4, and therefore a laminate of cesium (Cs), residing in Group 1 of the periodic table, and high conductivity silver (Ag) is used as the cathode material, and is formed at a film thickness on the order of 20 nm. Note that light developed in the organic compound layer 402 is released to the outside after passing through the cathode 408, and therefore it is necessary that the cathode have light transmittance. Cs is formed contacting the organic compound layer 402 based upon considering transmittivity in accordance with the film thickness of the materials forming the cathode 408, and in addition Ag is formed, making a laminate structure. Thus, is the cathode 408 is formed.

Figure 13:
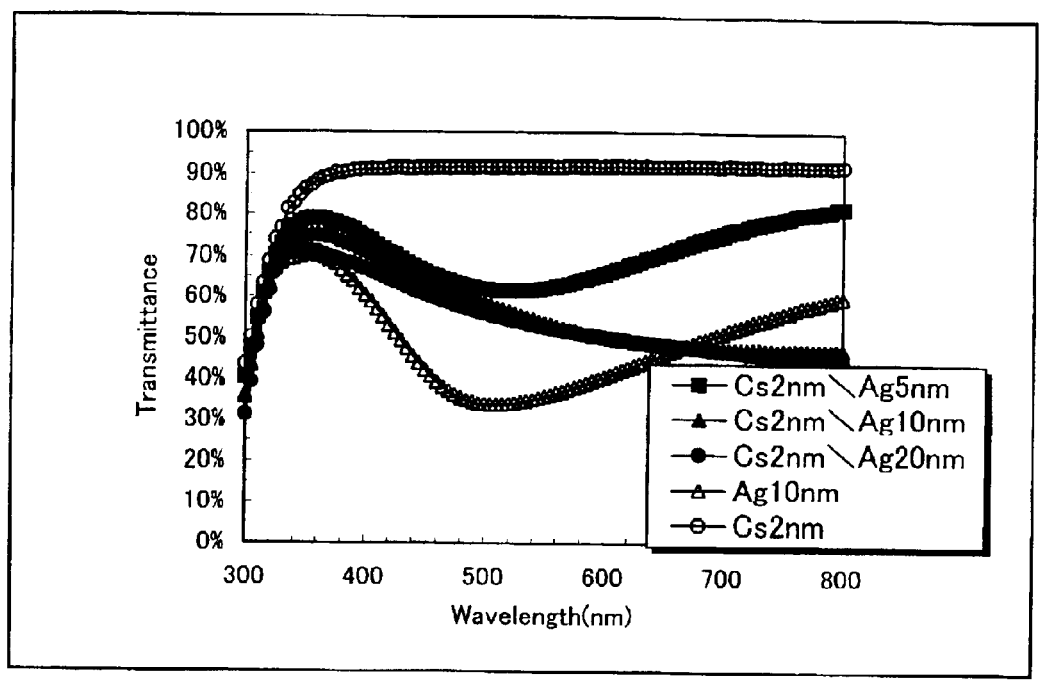
FIG. 13 is a diagram showing measurement results relating to transmittivity of a light emitting element.

Note that measurement results relating to the transmittivity of light when forming the cathode from an extremely thin film are shown in FIG. 13. In FIG. 13, light emitting elements are formed by changing the film thickness of the extremely thin film forming the cathode, and the transmittivity is measured.

The light emitting elements used here are for cases in which: the cathode is formed by using only 2 nm of cesium; the cathode is formed by using only 10 nm of silver; and the cathode is formed by laminating silver having a film thickness of 5 nm, 10 nm, or 20 nm on a cesium film formed at a thickness of 2 nm.

A state in which the film thickness reduces the transmittivity can be seen. Further, not only transmittivity, but also film resistance is very important, in order to use the films as second electrodes. If the resistance is high, then the materials cannot be used as electrode materials even if they have high transmittivity.

When the sheet resistance of these films was measured, and the laminate film of 2 nm of cesium and 10 nm of silver was measured at 218 Ω/□, and the laminate film of 2 nm of cesium and 20 nm of silver was measured at 13.4 Ω/□. The other films could not be measured.

Note that the average transmittivity for the cases in which 10 nm of silver and 20 nm of silver are laminated with respect to 2 nm of cesium is 56% for the former, and 54% for the latter. The average transmittivity as used here is the average value obtained when measuring the transmittivity at various wavelengths form 300 to 800 nm.

As is understood from the above results, by forming cesium and silver into a film thickness of from 2 nm and 20 nm, respectively, in Embodiment 1, an electrode can be formed having not only transmittivity, but having low film resistivity on the order capable of being used as a cathode. The cathode 408 is therefore formed by laminating 2 nm of cesium with 20 nm of silver in Embodiment 1, and the top emission type light emitting element disclosed in Embodiment Mode 3 can thus be obtained.

Note that cases of using only cesium elements are explained in Embodiment 1, but compounds such as cesium fluorides can also be used. These compounds may also be formed at a film thickness of several nm, similar to when only cesium elements are used.

[Embodiment 2]

In this embodiment, a method of simultaneously forming, on the same substrate; a pixel portion and TFTs (n-channel TFT and p-channel TFT) of a driver circuit formed in the periphery of the pixel portion and forming a light emitting element which connect to the TFT at pixel portion is described in detail using FIGS. 5 to 8. Note that, in this embodiment, light emitting element having the structure described in Embodiment Mode 1 is formed.

First, in this example, a substrate 600 is used, which is made from glass, such as barium borosilicate glass or aluminum borosilicate, represented by such as Corning

7059 glass and #1737. There is no limitation on the substrate 600 as long as a substrate having a light transparency is used, and a quartz substrate may also be used. A plastic substrate having heat resistance to a process temperature of this embodiment may also be used.

Then, a base film 601 formed from an insulating film such as a silicon oxide film, a silicon nitride film or a silicon oxynitride film. In this embodiment, a two-layer structure is used as the base film 601. However, a single-layer film or a lamination structure consisting of two or more layers of the insulating film may be used. As a first layer of the base film 601, a silicon oxynitride film 601a is formed into a thickness of 10 to 200 nm (preferably 50 to 100 nm) using $SiH_4$, $NH_3$, and $N_2O$ as reaction gases by plasma CVD. In this embodiment, the silicon oxynitride film 601a (composition ratio Si=32%, O=27%, N=24% and H=17%) having a film thickness of 50 nm is formed.

Then, as a second layer of the base film 601, a silicon oxynitride film 601b is formed so as to laminate thereon into a thickness of 50 to 200 nm (preferably 100 to 150 nm) using $SiH_4$ and $N_2O$ as reaction gases by plasma CVD. In this embodiment, the silicon oxynitride film 601b (composition ratio Si=32%, O=59%, N=7% and H=2%) having a film thickness of 100 nm is formed.

Subsequently, semiconductor layers 602 to 605 are formed on the base film 601. The semiconductor layers 602 to 605 are formed from a semiconductor film having an amorphous structure by a known method (a sputtering method, an LPCVD method, or a plasma CVD method), and is subjected to a known crystallization process (a laser crystallization method, a thermal crystallization method, or a thermal crystallization method using a catalyst such as nickel). The crystalline semiconductor film thus obtained is patterned into desired shapes to obtain the semiconductor layers. The semiconductor layers 602 to 605 are formed into the thickness of from 25 to 80 nm (preferably 30 to 60 nm). The material of the crystalline semiconductor film is not particularly limited, but it is preferable to form the film using silicon, a silicon germanium ($Si_{1-x}Ge_x$ (x=0.0001 to 0.02)) alloy, or the like.

In this embodiment, 55 nm thick amorphous silicon film is formed by plasma CVD, and then, nickel-containing solution is held on the amorphous silicon film. A dehydrogenating process of the amorphous silicon film is performed (500° C. for one hour), and thereafter a thermal crystallization process is performed (550° C. for four hours) thereto. Further, to improve the crystallinity thereof, laser anneal treatment is performed to form the crystalline silicon film. Then, this crystalline silicon film is subjected to a patterning process using a photolithography method, to obtain the semiconductor layers 602 to 605.

Further, before or after the formation of the semiconductor layers 602 to 605, a minute amount of impurity element (boron or phosphorus) may be doped to control a threshold value of the TFT.

Besides, in the case where the crystalline semiconductor film is manufactured by the laser crystallization method, a pulse oscillation type or continuous-wave type gas state laser or solid state laser. As the gas sate laser, excimer laser, Ar laser, or Kr laser may be used. As the solid state laser, YAG laser, $YVO_4$ laser, YLF laser, $YalO_3$ laser, glass laser, ruby laser, alexandrite laser, Ti: sapphire laser may be used.

In the case where those lasers are used, it is appropriate to use a method in which laser light radiated from a laser oscillator is condensed by an optical system into a linear beam, and is irradiated to the semiconductor film. Although the conditions of the crystallization should be properly selected by an operator, in the case where the exciter laser is used, a pulse oscillation frequency is set as 300 Hz, and a laser energy density is as 100 to 400 mJ/cm² (typically 200 to 300 mJ/cm²). In the case where the YAG laser is used, it is appropriate that the second harmonic is used to set a pulse oscillation frequency as 30 to 300 kHz, and a laser energy density is set as 300 to 600 mJ/cm² (typically, 350 to 500 mJ/cm²). Then, laser light condensed into a linear shape with a width of 100 to 1000 $\mu$m, for example, 400 $\mu$m is irradiated to the whole surface of the substrate, and an overlapping ratio (overlap ratio) of the linear laser light at this time may be set as 50 to 90%.

A gate insulating film 607 is then formed for covering the semiconductor layers 602 to 605. The gate insulating film 607 is formed from an insulating film containing silicon by plasma CVD or sputtering into a film thickness of from 40 to 150 nm. In the embodiment, the gate insulating film 607 is formed from a silicon oxynitride film into a thickness of 110 nm by plasma CVD (composition ratio Si=32%, O=59%, N=7%, and H=2%). Of course, the gate insulating film 607 is not limited to the silicon oxynitride film, an insulating film containing other silicon may be formed into a single layer of a lamination structure.

Beside, when the silicon oxide film is used, it can be formed by plasma CVD in which TEOS (tetraethyl orthosilicate) and $O_2$ are mixed, with a reaction pressure of 40 Pa, a substrate temperature of from 300 to 400° C., and discharged at a high frequency (13.56 MHz) power density of 0.5 to 0.8 W/cm². Good characteristics as the gate insulating film can be obtained in the silicon oxide film thus manufactured by subsequent thermal annealing at 400 to 500° C.

Then, as shown in FIG. 5A, on the gate insulating film 607, a first conductive film 608 and a second conductive film 609 are formed into lamination to have a film thickness of 20 to 100 nm and 100 to 400 nm, respectively. In this embodiment, the first conductive film 608 made from a TaN film with a film thickness of 30 nm and the second conductive film 609 made from a W film with a film thickness of 370 nm are formed into lamination. The TaN film is formed by sputtering with a Ta target under an atmosphere containing nitrogen. Besides, the W film is formed by the sputtering method with a W target. The W film may be formed by thermal CVD using tungsten hexafluoride ($WF_6$).

Whichever method is used, it is necessary to make the material have low resistance for use as the gate electrode, and it is preferred that the resistivity of the W film is set to less than or equal to 20 $\mu\Omega$cm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film having high purity by sputtering using a target having a purity of 99.9999%, and in addition, by taking sufficient consideration to prevent impurities within the gas phase from mixing therein during the film formation, a resistivity of from 9 to 20 $\mu\Omega$cm can be realized.

Note that, in this embodiment, the first conductive film 608 is made of TaN, and the second conductive film 609 is made of W, but the material is not particularly limited thereto, and either film may be formed of an element selected from Ta, W, Ti, Mo, Al, Cu, Cr and Nd or an alloy material or a compound material containing the above element as its main ingredient. Besides, a semiconductor film typified by a polycrystalline silicon film doped with an impurity element such as phosphorus may be used. Also, an alloy containing Ag, Pd, Cu can be used.

Besides, any combination may be employed such as a combination in which the first conductive film 608 is formed of tantalum (Ta) and the second conductive film 609 is formed of W, a combination in which the first conductive film 608 is formed of titanium nitride (TiN) and the second conductive film 609 is formed of W, a combination in which the first conductive film 608 is formed of tantalum nitride (TaN) and the second conductive film 609 is formed of Al, or a combination in which the first conductive film 608 is formed of tantalum nitride (TaN) and the second conductive film 609 is formed of Cu, or a combination in which the first conductive film 608 is formed of W, Mo, or the combination of W and Mo and the second conductive film 609 is formed of Al and Si or Al and Ti or Al and Sc or Al and Nd, further, the third conductive film (not shown) is formed from Ti, TiN or the combination of Ti and TiN.

Next, masks 610 to 613 made of resist are formed using a photolithography method, and a first etching process is performed in order to form electrodes and wirings as shown in FIG. 5B. This first etching process is performed with the first and second etching conditions. In this embodiment, as the first etching conditions, an ICP (inductively coupled plasma) etching method is used, a gas mixture of $CF_4$, $Cl_2$ and $O_2$ is used as an etching gas, the gas flow rate is set to 25/25/10 seem, and plasma is generated by applying a 500 W RF (13.56 MHz) power to a coil shape electrode under 1 Pa. A dry etching device with ICP (Model E645-□ICP) produced by Matsushita Electric Industrial Co. Ltd. is used here. A 150 W RF (13.56 MHz) power is also applied to the substrate side (test piece stage) to effectively apply a negative self-bias voltage.

The W film is etched with the first etching conditions, and the end portion of the first conductive layer is formed into a tapered shape. In the first etching conditions, the etching rate for W is 200.39 nm/min, the etching rate for TaN is 80.32 nm/min, and the selectivity of W to TaN is about 2.5. Further, the taper to angle of W is about 26° with the first etching conditions.

Thereafter, as shown in FIG. 5B, the first etching conditions are changed into the second etching conditions without removing the masks 610 to 613 made of resist, a mixed gas of $CF_4$ and $Cl_2$ is used as an etching gas, the gas flow rate is set to 30/30 sccm, and plasma is generated by applying a 500 W RF (13.56 MHz) power to a coil shape electrode under 1 Pa to thereby perform etching for about 15 seconds. A 20 W RF (13.56 MHz) power is also applied to the substrate side (test piece stage) to effectively a negative self-bias voltage. The W film and the TaN film are both etched on the same order with the second etching conditions in which $CF_4$ and $Cl_2$ are mixed.

In the second etching conditions, the etching rate for W is 58.97 nm/min, and the etching rate for TaN is 66.43 nm/min. Note that, the etching time may be increased by approximately 10 to 20% in order to perform etching without any residue on the gate insulating film.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 615 to 618 (first conductive layers 615a to 618a and second conductive layers 615b to 618b) constituted of the first conductive layers and the second conductive layers are formed by the first etching process. Reference numeral 620 denotes a gate insulating film, and regions of the gate insulating film which are not covered by the first shape conductive layers 615 to 618 are made thinner by approximately 20 to 50 nm by etching.

Then, a first doping process is performed to add an impurity element for imparting an n-type conductivity to the semiconductor layer without removing the mask made of resist (FIG. 5B). Doping may be carried out by an ion doping method or an ion injecting method. The condition of the ion doping method is that a dosage is $1\times10^{13}$ to $5\times10^{15}$ atoms/$cm^2$, and an acceleration voltage is 60 to 100 keV. In this embodiment, the dosage is $1.5\times10^{15}$ atoms/$cm^2$ and the acceleration voltage is 80 keV.

As the impurity element for imparting the n-type conductivity, an element which belongs to Group 15 of the periodic table, typically phosphorus (P) or arsenic (As) is used, and phosphorus is used here. In this case, the conductive layers 615 to 618 become masks to the impurity element for imparting the n-type conductivity, and high concentration impurity regions 621 to 624 are formed in a self-aligning manner. The impurity element for imparting the n-type conductivity is added to the high concentration impurity regions 621 to 624 in the concentration range of $1\times10^{20}$ to $1\times10^{21}$ atoms/$cm^3$.

Thereafter, the second etching process is performed without removing the masks made of resist as shown in FIG. 5C. The second etching process is performed by third or fourth etching condition. Here, a mixed gas of $CF_4$, $Cl_2$ is used as an etching gas, the gas flow rate is set to 30/30 sccm, and plasma is generated by applying a 500 W RF (13.56 MHz) power to a coil shape electrode under 1 Pa to thereby perform etching for about 60 seconds. A 20 W RF (13.56 MHz) power is also applied to the substrate side (test piece stage) to effectively apply a negative self-bias voltage. The W film and the TaN film are both etched on the same order with the third etching conditions in which $CF_4$ and $Cl_2$ are mixed.

In the second etching process, the etching rate for W is 58.97 nm/min, the etching rate for TaN is 66.43. Note that, the etching time may be increased by approximately 10 to 20% in order to perform etching without any residue on the gate insulating film.

Thereafter, as shown in FIG. 5C, the third etching conditions are changed into the fourth etching conditions. Without removing the masks 610 to 613 made of resist, a mixed gas of $CF_4$, $Cl_2$ and $O_2$ is used as an etching gas, the gas flow rate is set to 20/20/20 sccm, and plasma is generated by applying a 500 W RF (13.56 MHz) power to a coil shape electrode under 1 Pa to thereby perform etching for about 20 seconds. A 20 W RF (13.56 MHz) power is also applied to the substrate side (test piece stage) to effectively apply a negative self-bias voltage.

In the fourth etching conditions, etching rate for TaN is 14.83 nm/min. Therefore, the W film etched selectively. According to the fourth etching process, the second conductive layers 626 to 629 (first conductive layer 626a to 629a and second conductive layers 626b to 629b) are formed.

Next, a second doping process is performed as shown in FIG. 6A. Second conductive layers 626b to 629b are used as masks to an impurity element, and doping is performed such that the impurity element is added to the semiconductor layer below the tapered portions of the first conductive layers. In this embodiment, phosphorus (P) is used as the impurity element, and plasma doping is performed with the dosage of $1.5\times10^{14}$ atoms/$cm^2$, current density of 0.5 μA and the acceleration voltage of 90 keV.

Thus, low concentration impurity regions 631a to 634a, which overlap with the first conductive layers and low concentration impurity regions 631b to 634b, which do not overlap with the first conductive layers are formed in a self-aligning manner. The concentration of phosphorus (P) in the low concentration impurity regions 631 to 634 is $1\times10^{17}$ to $5\times10^{18}$ atoms/cm$^3$. Further, the impurity element is added to the high concentration impurity regions 621 to 624 and the high concentration impurity regions 635 to 638 are formed.

New masks are formed from resist (639 and 640), and a third doping process is performed as shown in FIG. 6B. Impurity regions 641 to 642, to which an impurity element is added that imparts the opposite conductivity type (p-type) from the single conductivity type (n-type) are formed to the semiconductor layers, which become active layers of p-channel TFTs, by the third doping process. The first conductive layers 627a and the second conductive layer 627b are used as masks against the impurity element, the impurity element imparting p-type conductivity is added, and the impurity regions are formed in a self-aligning manner.

The impurity regions 641 to 642 are formed in Embodiment 2 by ion doping using diborane (B$_2$H$_6$). Phosphorous is added to the impurity regions 641 to 642 in differing concentrations, respectively, by the first doping process and by the second doping process. However, doping is performed such that the concentration of the impurity element which imparts p-type conductivity to each of the regions becomes from $2\times10^{20}$ to $2\times10^{21}$ atoms/cm$^3$, and therefore no problems will develop with the regions functioning as source regions and drain regions of p-channel TFTs.

The resist masks 639 and 640 are removed next, and a first interlayer insulating film 643 is formed as shown in FIG. 6C. In this embodiment, as the first inter layer insulating film 643, the lamination film is formed from the first insulating film 643a containing silicon and nitride and the second insulating film 643b containing silicon and oxygen.

An insulting film containing silicon is formed having a thickness of 100 to 200 nm, using plasma CVD or sputtering, as the first interlayer insulating film 643a. A silicon oxynitride film is formed with a film thickness of 100 nm by plasma CVD in Embodiment 2. The first interlayer insulating film 643a is of course not limited to the silicon oxynitride film, and other insulating films containing silicon may be used in a single layer or a lamination structure.

Next, a process for activating the impurity elements added to each of the semiconductor layers is performed. Thermal annealing using an annealing furnace is performed for the activation process. Thermal annealing may be performed in a nitrogen atmosphere having an oxygen concentration of 1 ppm or less, preferably 0.1 ppm or less, at 400 to 700° C., typically between 500 and 550° C. The activation process is performed in Embodiment 2 by heat treatment at 550° C. for four hours. Note that, in addition to thermal annealing, laser annealing and rapid thermal annealing (RTA) can also be applied.

Note also that, in Embodiment 2, nickel used as a catalyst during crystallization is gettered into the impurity regions 635, 637, and 638 containing phosphorous at a high concentration at the same time as the above activation process is performed. The nickel concentration within the semiconductor layers that mainly-become channel forming regions is thus reduced. The value of the off current is reduced for TFTs having channel forming regions thus formed, and a high electric field effect mobility is obtained because of the good crystallinity. Thus, good properties can be achieved.

Further, the activation process may also be performed before forming the first interlayer insulating film. However, when using a wiring material which is weak with respect to heat, it is preferable to perform the activation process after forming the interlayer insulating film (insulating film containing silicon as its main constituent, silicon nitride film, for example) in order to protect the wirings and the like, as in Embodiment 2.

The doping process may be performed, and the first interlayer insulating film may be formed after performing the activation process.

In addition, heat treatment is performed for 1 to 12 hours at 300 to 550° C. in an atmosphere containing hydrogen of 3 to 100%, performing hydrogenation of the semiconductor layers. Heat treatment is performed for one hour at 410° C. in a atmosphere containing approximately 3% hydrogen in Embodiment 2. This process is one for terminating dangling bonds of the semiconductor layers by hydrogen contained in the interlayer insulating film. Plasma hydrogenation (using hydrogen excited by plasma) may be performed as another means of hydrogenation.

Further, when using a laser annealing method as the activation process, it is preferable to irradiate laser light such as that from an excimer laser or a YAG laser after performing the above hydrogenation process.

A second interlayer insulating film 643b is formed next on the first interlayer insulating film 643a from insulating film containing silicon with a thickness of 1 to 2 $\mu$m by plasma CVD or sputtering. An oxynitride film having a film thickness of 1.2 $\mu$m is formed in Embodiment 2. Of course, the second insulating film 643b is not limited to the above mentioned film, an insulating film containing other silicon may be formed into a single layer or a lamination structure.

Then the first interlayer insulating film 643 made from first insulating film 643a and second insulating film 643b can be formed.

Next, patterning is performed in order to form contact holes for reaching the impurity regions 635, 636, 637, and 638.

In addition, the first insulating film 643a and the second insulating film 643h are insulating film contained silicon formed plasma CVD, so that dry etching method or wet etching method can be used for forming a contact hole. However, in this embodiment, wet etching method is used for etching the first insulating film, and the dry etching method is used for etching the second insulating film.

First, the second insulating film 643b is etched. Here, a mixed solution (Stella chemifa Inc., brand name LAL 500) contained 7.13% of hydrogen ammonium fluoride (NH$_4$HF$_2$) and 15.4% of ammonium fluoride (NH$_4$F) is used as a etchant to conduct a wet etching at 20° C.

Next, the first insulating film 643a is etched. CHF$_4$ is used as an etching gas, and gas flow rates are set to 35 sccm. An 800 W RF electric power is applied at a pressure of 7.3 Pa, and dry etching is performed.

Wirings 645 to 651 are formed that connect electrically with high concentration impurity regions 635, 636, 637, and 638 respectively. In this embodiment, these wirings are formed by patterning Al film in 500 nm thicknesses. Besides, a single layer constituted Ti, TiN, Al: Si and the like, or a lamination layer laminated Ti, TiN, Al: Si, and Ti in turn can also be used. (FIG. 7A)

Further, the conductive material 653 to be a cathode is formed so as to contact with the wiring 652. The conductive material 653 is formed by being deposited in 110 nm in thickness and patterned using Mg:Ag as a cathode material.

The insulating film 654 is formed in 1 $\mu$m thickness on the conductive material 653. (FIG. 7B) As material forming an insulating film, a film containing silicon oxide is used in this embodiment. Another films such as insulating film containing silicon nitride, or silicon oxide nitride, the organic resin film, polyimide, polyamide, acrylic (photosensitive acrylic is included), BCB (benzocyclobutene), or the like may also be used.

The insulator 654 and the conductive material 653 is polished by using CMP method. Here, ammonia solution dispersed silica is used as slurry. The process by another CMP method is omitted the description because it is described in FIGS. 1A to 1C. With the process, a cathode 655 and a planarized insulating film 656 are formed as shown in FIG. 7C, and thus flat faces by these are formed.

As shown in FIG. 8A, an organic compound layer 657 is formed by an evaporation method on the cathode 655. For the materials to form the organic compound layer, combination materials shown in Embodiment Modes can be used.

Next, an anode 658 is formed covering the organic compound layer 657 and the planarized insulating film 656 as shown in FIG. 8B. In this embodiment, as a material of forming the anode 658, an indium-tin oxide (ITO) film is used. When a transparent conductive film have a large work function, another known materials can be used to form the anode 658.

As shown in FIG. 8B, an element substrate having a light emitting element 659 that is composed of the cathode 655 connected to the current control TFT 704 electrically, the planarized insulating film 656 formed between the cathode 655 and the cathode included in next pixel, the organic conductive layer 657 formed on the cathode 655, and the anode 658 formed on the organic compound layer 657 and the planarized insulating film 656 can be formed.

Note that, in the process of manufacturing the light emitting device in this embodiment, although the source signal lines are formed by materials which form the gate electrodes, and although the gate signal lines are formed by wiring materials which forms the source and drain electrodes, with relation to the circuit structure and process, other materials may also be used.

Further, a driver circuit 705 having an n-channel TFT 701 and a p-channel TFT 702, and a pixel portion 706 having a switching TFT 703 and a current control TFT 704 can be formed on the same substrate.

The n-channel TFT 701 of the driver circuit 705 has the channel forming region 501, the low concentration impurity region 631a (GOLD region) which overlaps with the first conductive layer 626a forming a portion of the gate electrode, the low concentration impurity region 631b (LDD region) which does not overlaps with the first conductive layer 626a, and the high concentration impurity region 635 which functions as a source region or a drain region. The p-channel TFT 702 has the channel forming region 502, and the impurity regions 641 and 642 that function as source regions or drain regions.

The switching TFT 703 of the pixel portion 706 has the channel forming region 503, the low concentration impurity region 633a (GOLD region) which overlap with the first conductive layer 628a, the low concentration impurity region 633b (LDD region) which does not overlap with the first conductive layer 628a, and the high concentration impurity region 637 which functions as a source region or a drain region.

The current control TFT 704 of the pixel portion 706 has the channel forming region 504, the low concentration impurity region 634a (GOLD region) which overlap with the first conductive layer 629a, the low concentration impurity region 634b (LDD region) which does not overlap with the first conductive layer 628a, and the high concentration impurity region 638 which function as source regions or drain regions.

In this embodiment, the driving voltage of a TFT is 1.2 to 10 V, preferably 2.5 to 5.5 V.

When the display of the pixel portion is active (case of the moving picture display), a background is displayed by pixels in which the light emitting elements emit light and a character is displayed by pixels in which the light emitting elements do not emit light. However, in the case where the moving picture display of the pixel portion is still for a certain period or more (referred to as a standby time in the present specification), for the purpose of saving electric power, it is appropriate that a display method is changed (inverted). Specifically, a character is displayed by pixels in which light emitting elements emit light (also called a character display), and a background is displayed by pixels in which light emitting elements do not emit light (also called a background display).

Figure 10A:
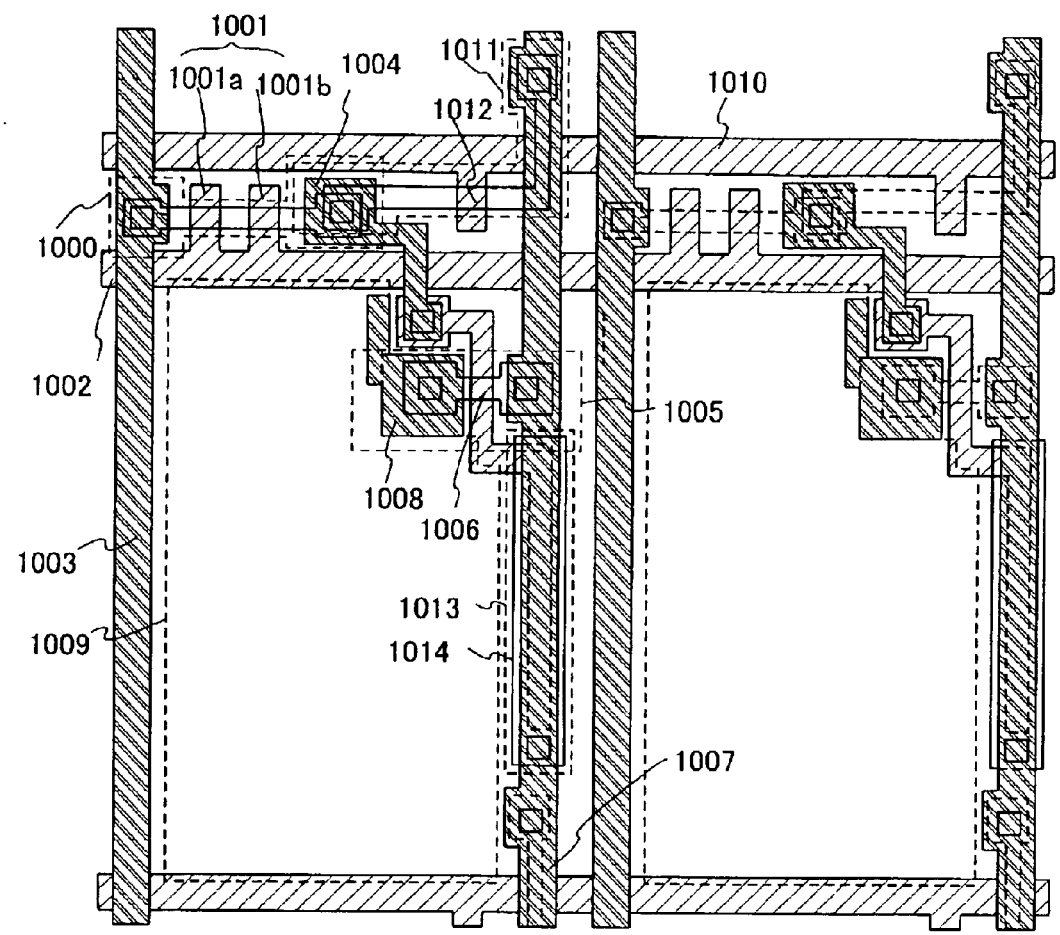
FIGS. 10A and 10B are top views of a pixel portion of the light emitting device.
Figure 10B:
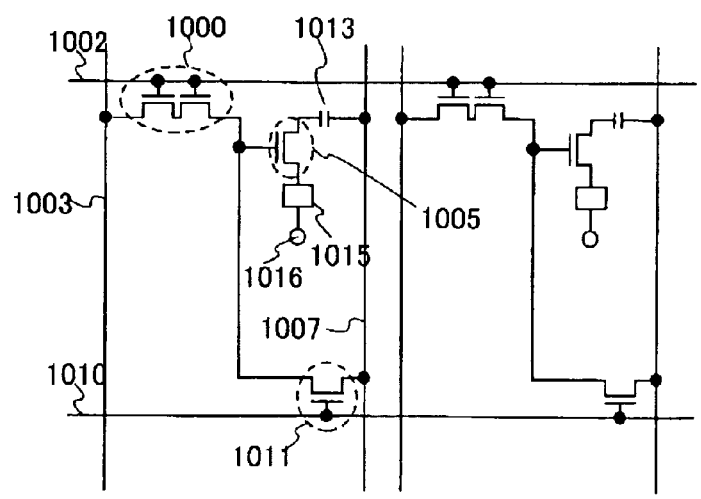

A detailed top surface structure of a pixel portion is shown in FIG. 10A, and a circuit diagram thereof is shown in FIG. 10B. FIGS. 10A and 10B denoted by a same reference numerals.

In FIGS. 10A and 10B, a switching TFT 1000 provided on a substrate is formed by using the switching TFT (n-channel type) TFT 703 of FIG. 8B. Therefore, an explanation of the switching (n-channel type) TFT-703 may be referred for an explanation of the structure. Further, a wiring indicated by reference numeral 1002 is a gate wiring for electrically connecting with gate electrodes 1001 (1101a and 1001b) of the switching TFT 1000.

Note that, in this embodiment, a double gate structure is adopted, in which two channel forming regions are formed, but a single gate structure, in which one channel forming region is formed, or a triple gate structure, in which three channel forming regions are formed, may also be adopted.

Further, a source of the switching TFT 1000 is connected to a source wiring 1003, and a drain thereof is connected to a drain wiring 1004. The drain wiring 1004 is electrically connected with a gate electrode 1006 of a current control TFT 1005. Note that the current control TFT 1005 is formed by using the current control (n-channel type) TFT 704 of FIG. 8B. Therefore, an explanation of the current control (n-channel type) TFT 704 may be referred for an explanation of the structure. Note that, although the single gate structure is adopted in this embodiment, the double gate structure or the triple gate structure may also be adopted.

Further, a source of the current control TFT 1005 is electrically connected with a current supply line 1007, and a drain thereof is electrically connected with a drain wiring 1008. Besides, the drain wiring 1008 is electrically connected with a cathode 1009 indicated by a dotted line.

A wiring indicated by reference numeral 1010 is a gate wiring connected with the gate electrode 1012 of the erasing TFT 1011. Further, a source of the erasing TFT 1011 is electrically connected to the current supply line 1007, and a drain thereof is electrically connected to the drain wiring 1004.

The erasing TFT 1011 is formed like a current controlling TFT (n-channel type) 704 in FIG. 8B. Therefore, an explanation of the structure is referred to that of the current controlling TFT (n-channel type) 704. In this embodiment, a single gate structure is described though, a double gate structure or a triple gate structure can be used.

At this time, a storage capacitor (condenser) is formed in a region indicated by reference numeral 1013. The capacitor 1013 is formed by a semiconductor film 1014 electrically connected with the current supply line 1007, an insulating film (not shown) of the same layer as a gate insulating film, and the gate electrode 1006. Further, a capacitor formed by the gate electrode 1006, the same layer (not shown) as a first interlayer insulating film, and the current supply line 1007 may be used as a storage capacitor.

The light emitting element 1015 shown in circuit diagram in FIG. 10B is composed of the cathode 1009, an organic compound layer (not illustrated) formed on the cathode 1009, and an anode (not illustrated) formed on the organic compound layer. In the present invention, the cathode 1009 is connected with a source region and a drain region of the current controlling TFT 1005.

A counter potential is supplied to the anode of the light emitting element 1005. In addition, the power source potential is supplied to the power supply line V. A potential difference between the counter potential and the power source potential is always maintained at such a level that causes the light emitting element to emit light when the power source potential is applied to the pixel electrode. The power source potential and the counter potential are supplied to the light emitting device of the present invention by means of a power source provided by an externally-attached IC chip or the like. In the present specification, the power source supplying a counter potential is referred to as the counter power source 1016.

[Embodiment 3]

In this embodiment, the structure of the pixel portion of the light emitting device that is different from shown in Embodiment 1 is described with reference to FIGS. 9A and 9H.

Figure 9A:
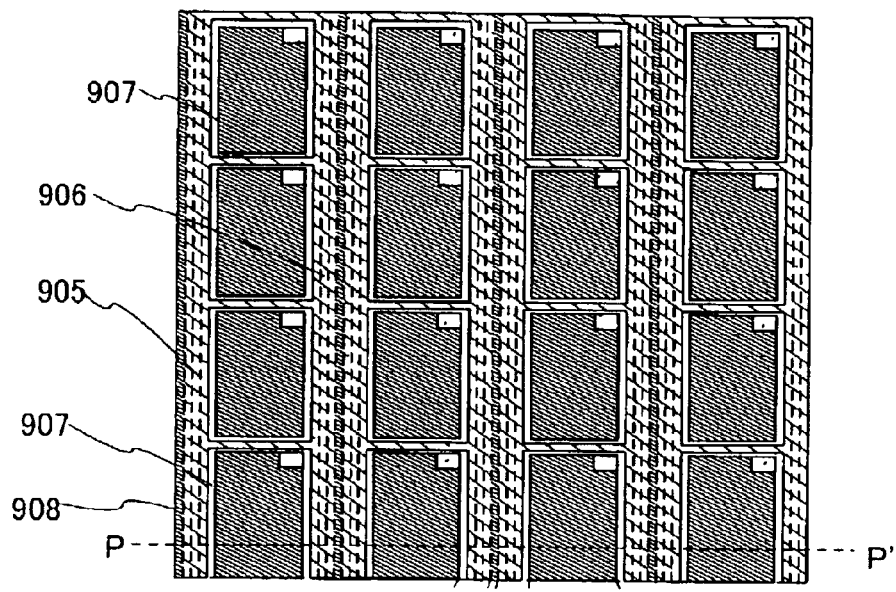
FIGS. 9A and 9B are diagrams for explaining an element structure of the light emitting device of the present invention.

FIG. 9A is a top-surface view of the pixel portion that is a pixel 907 formed into active matrix shape in the light emitting device having a driver circuit and a pixel portion.

Between the pixel portion 907, a source line 905 and a current supply line 906 is formed that is electrically connected with the driver circuit. In this embodiment, between the source line 905 and the current supply line 906, an auxiliary electrode 908 made of a conductive materials is formed.

In each pixel portion 907 shown in FIG. 9A, a first electrode 909 is formed, which is made of conductive film having light shielding effect that is to be as an anode of the light emitting element. Specifically, for improving an injection of hole from an anode, it is preferably to use materials having large work function. As materials for forming the first electrode 909, metal material such as platinum (Pt), chrome (Cr), tungsten (W), or nickel (Ni) can be used.

Figure 9B:
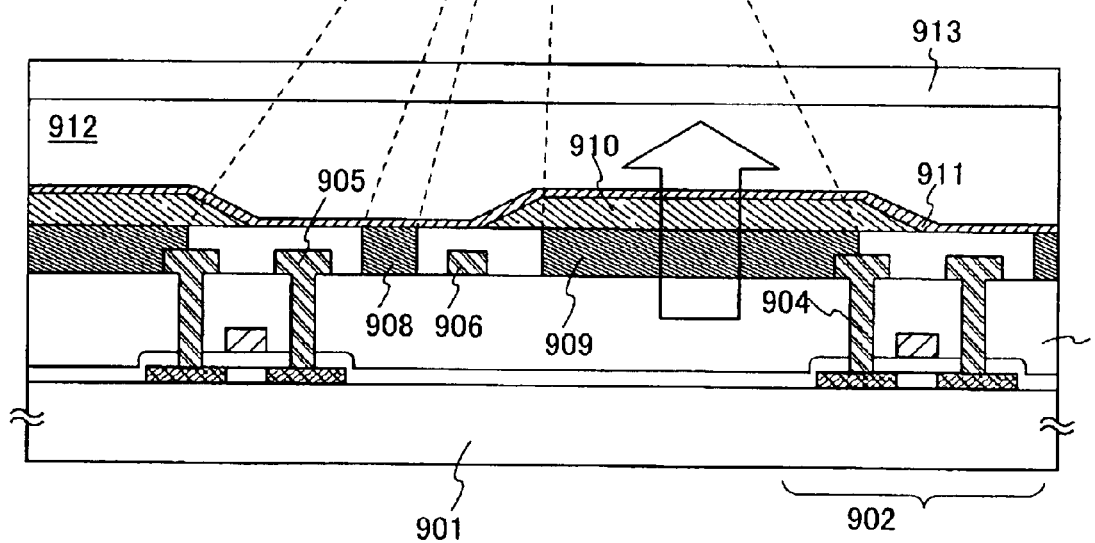

FIG. 9B is a cross-sectional view of the top-surface view of FIG. 9A taken along the line P–P'. It shows a light emitting device as a complete state that is formed until the state in FIG. 9A. On the first electrode 909 formed in each pixel 907, an organic compound layer 910 is formed. The organic compound layer 910 is formed to cover the first electrode 909 completely.

Next, the second electrode 911 is formed on the organic compound layer 910. In this embodiment, the second electrode 911 is formed by a transparent conductive film that is to be a cathode of the light emitting element. Specifically, for improving an injection of an electron from a cathode, it is preferably to use materials having small work function. The material belonging to an alkaline metal or alkaline-earth metals can be used alone, laminating can be carried out to other material, or the alloy formed with other material can be used. In addition, in this embodiment, second electrode 911 can be formed by laminating of the aluminum or silver which has the cesium (Cs) which is an alkaline metal, and conductivity.

In addition, in this embodiment, since second electrode 911 is an electrode which penetrate the light generated in the light emitting element, it needs to have transparency. Therefore, the cesium film formed in contact with the organic compound layer 910 is formed by 2 nm in thick, and the aluminum film or silver film laminated thereof is formed by 20 nm in thick.

An electrode that has the light transparency can be formed in this way by forming second electrode 911 that consists of a extremely-thin film.

In addition, since second electrode 911 formed here is formed in contact with auxiliary electrode 908 formed simultaneously with first electrode 909, it can lower film resistance of the second electrode.

Thus, since the film resistance can be suppressed when the second electrode is formed extremely-thin film, in order to secure the transmittance of the second electrode, driver voltage can be suppressed.

In addition, in the case of the other element structures shown by Embodiment Modes 1 and 2, it combines freely, and composition of this case of this embodiment can be carried out.

[Embodiment 4]

Figure 11A:
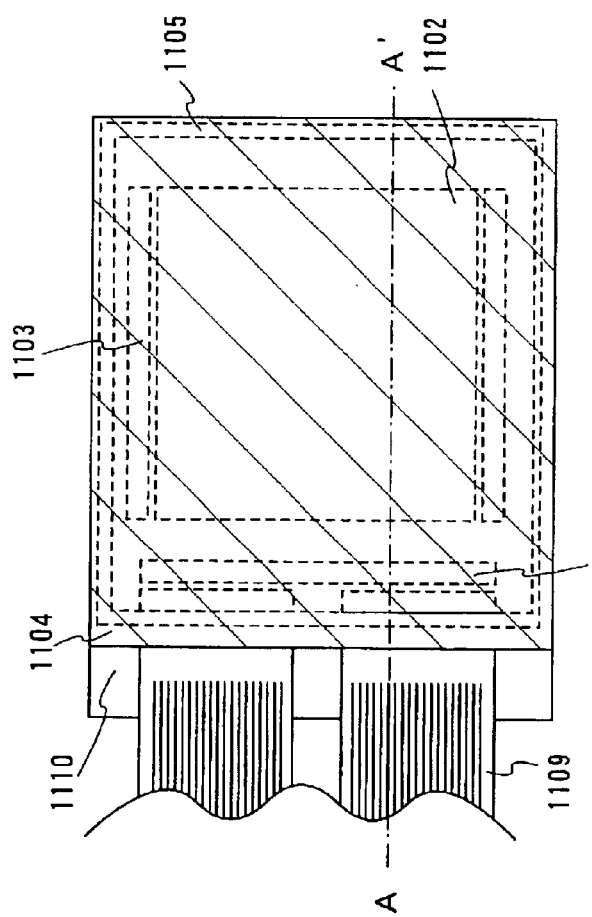
FIGS. 11A and 11B are diagrams for explaining an element structure of the light emitting device of the present invention.
Figure 11B:
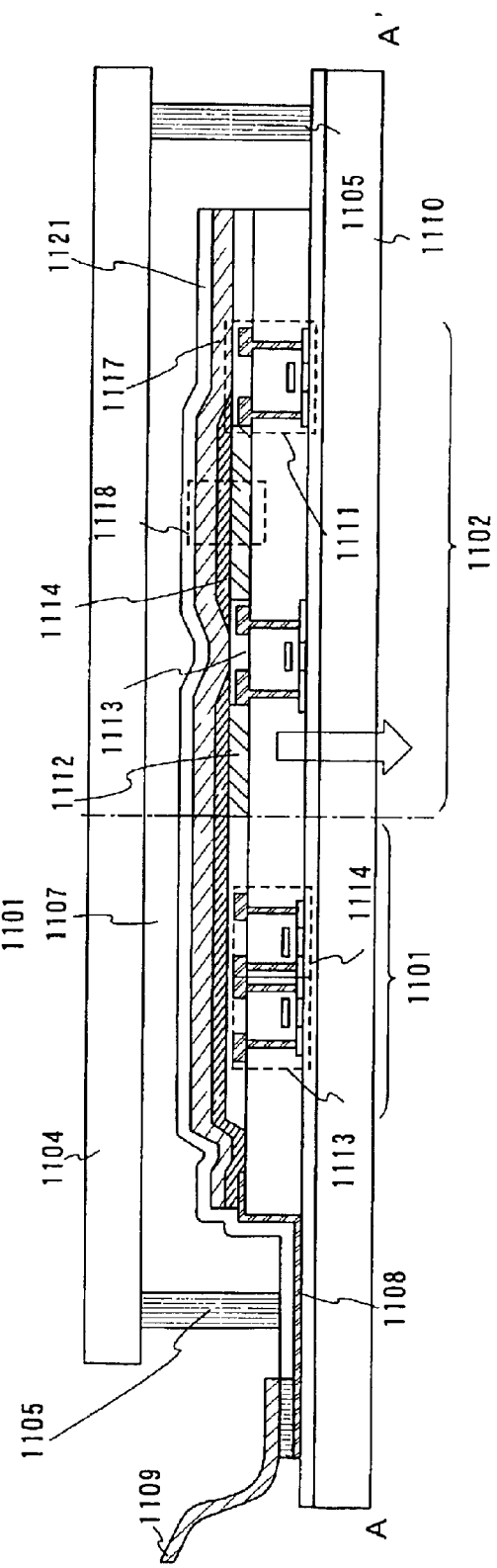

Referring to FIG. 11, the external appearance of an active matrix type light emitting device of the present invention will be described in Embodiment 4. FIG. 11A is a top view of the light emitting device, and FIG. 11B is a sectional view taken on line A–A' of FIG. 11A. Reference number 1101 represents a source signal line driver circuit, which is shown by a dotted line; 1102, a pixel portion; 1103, a gate signal line driver circuit; 1104, a cover material; and 1105, a sealant. Inside surrounded by the sealant 1105 is an empty space.

Reference number 1108 represents wiring for transmitting signals inputted to the source signal line driver circuit 1101 and the gate signal line driver circuit 1103. The wiring 1108 receives video signals or clock signals from a flexible print circuit (FPC) 1109, which will be an external input terminal. Only the FPC is illustrated, but a printed wiring board (PWB) may be attached to this FPC. The light emitting device referred to in the present specification may be the body of the light emitting device, or a product wherein an FPC or a PWB is attached to the body.

The following will describe a sectional structure, referring to FIG. 11B. The driver circuits and the pixel portion are formed on the substrate 1110, but the source signal line driver circuit 1101 as one of the driver circuits and the pixel portion 1102 are shown in FIG. 11B.

In the source signal line driver circuit 1101, a CMOS circuit wherein an n-channel type TFT 1113 and a p-channel type TFT 1114 are combined is formed. The TFTs constituting the driver circuit may be composed of known CMOS circuits, PMOS circuits or NMOS circuits. In Embodiment 4, a driver-integrated type, wherein the driver circuit is formed on the substrate, is illustrated, but the driver-integrated type may not necessarily be adopted. The driver may be fitted not to the substrate but to the outside.

The pixel portion 1102 is composed of plural pixels including a current-controlling TFT 1111 and an anode 1112 electrically connected to the drain of the TFT 1111.

On the both sides of the anode 1112, insulating layer 1113 are formed, and an organic compound layer 1114 formed right on the anode 1112. Furthermore, a cathode 1114 is formed on the organic compound layer 1114. In this way, a light emitting element 1118 composed of the anode 1112, the organic compound layer 1114 and the cathode 1117 is formed.

The cathode 1117 also functions as a wiring common to all of the pixels. And the cathode 1117 is electrically connected through the interconnection line 1108 to the FPC 1109.

In order to confine the light emitting element 1118 formed on the substrate 1110 airtightly, the cover material 1104 is adhered to the substrate 1110 with the sealant 1105. A spacer made of a resin film may be set up to keep a given interval between the cover material 1104 and the light emitting element 1118. An inert gas such as nitrogen is filled into the space 1107 inside the sealant 1105. As the sealant 1105, an epoxy resin is preferably used. The sealant 705 is desirably made of a material through which water content or oxygen is transmitted as slightly as possible. Furthermore, it is allowable to incorporate a material having moisture absorption effect or a material having anti-oxidation effect into the space 1107.

In Embodiment 4, as the material making the cover material 1104, there may be used a glass substrate, a quartz substrate, or a plastic substrate made of fiber glass-reinforced plastic (FRP), polyvinyl fluoride (PVF), mylar, polyester or polyacrylic resin. After the adhesion of the cover material 1105 to the substrate 1110 with the sealant 1105, a sealant is applied so as to cover the side faces (exposure faces).

As described above, the light emitting element is airtightly put into the space 1107, so that the light emitting element can be completely shut out from the outside and materials promoting deterioration of the organic compound layer, such as water content and oxygen, can be prevented from invading this layer from the outside. Consequently, the light emitting device can be made highly reliable.

The structure of Embodiment 4 may be freely combined with the structure of Embodiments 1 to 3.

[Embodiment 5]

Embodiments 1 to 4 describes an active matrix type light emitting device having a top gate TFT. However, the TFT structure of the present invention is not limited thereto and bottom gate TFTs (typically reverse stagger TFTs) may also be used in carrying out the present invention as shown in FIG. 12B. The reverse stagger TFTs may be formed by any method.

Figure 12A:
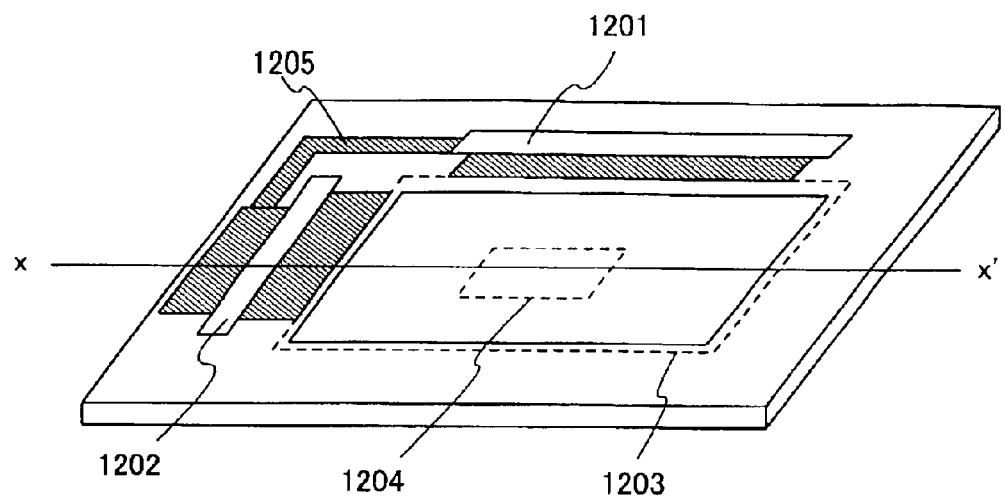
FIGS. 12A and 12B are diagrams for explaining the structure of a reverse stagger TFT.
Figure 12B:
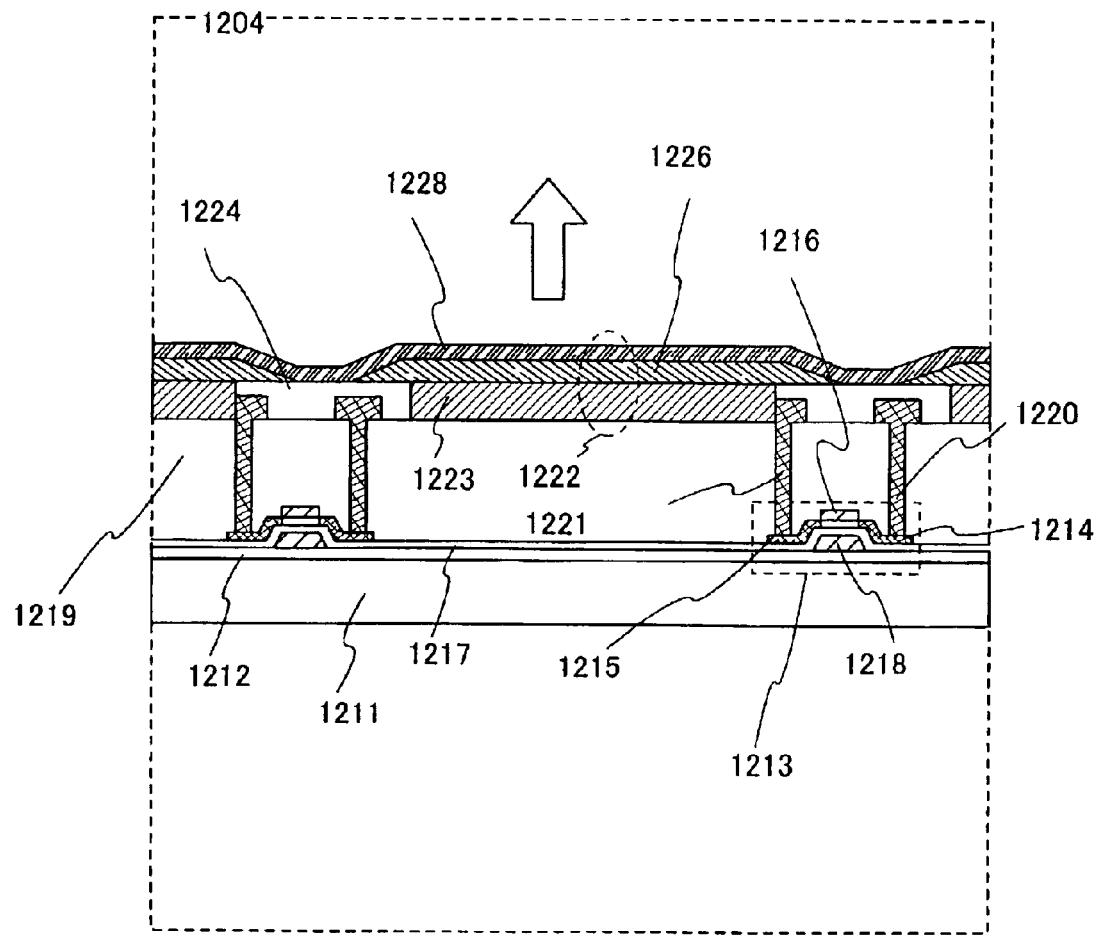

FIG. 12A is a top view of a light emitting device that uses bottom gate transistors. Note that the sealing in not conducted yet by sealing substrate. A source side driving circuit 1201, a gate side driving circuit 1202, and a pixel portion 1203 are formed therein. FIG. 12B shows in section a region a 1204 of the pixel portion 1203. The sectional view is obtained by cutting the light emitting device along the line x–x' in FIG. 12A.

FIG. 12B illustrates only a current controlling TFT out of TFTs that constituted in a pixel portion 1203. Reference symbol 1211 denotes a substrate and 1212 denotes an insulating film to serve as a base (hereinafter referred to as a base film). A transparent substrate is used for the substrate 11211, typically, a glass substrate, a quartz substrate, a glass ceramic substrate, or a crystallized glass substrate. However, the one that can withstand the highest process temperature during the manufacture process has to be chosen.

The base film 1212 is effective especially when a substrate containing a movable ion or a conductive substrate is used. If a quartz substrate is used, the base film may be omitted. An insulating film containing silicon is used for the base film 1212. The term insulating film containing silicon herein refers to an insulating film containing oxygen or nitrogen in a given ratio to the content of silicon, specifically, a silicon oxide film, a silicon nitride film, or a silicon oxynitride film ($SiO_xN_y$: x and y are arbitrary integers).

Reference symbol 1213 denotes a current controlling TFT that is a p-channel transistor. Note that, in this embodiment, cathode 1223 of light emitting element 1222 is connected the current control transistor 1213. Therefore, the cathode 1223 are preferably made from p-channel TFT but also made from n-channel TFT.

The current controlling transistor 1213 is composed of an active layer which comprising source region 1214, drain region 1215 and channel forming region 1216, a gate insulating film 1217, a gate electrode 1218, a interlayer insulating film 1219, a source wiring line 1220, and a drain wiring line 1221. The current controlling transistor 1213 in this example is a p-channel transistor.

The switching TFT has a drain region connected to the gate electrode 1218 of the current controlling TFT 1213. The gate electrode 1218 of the current controlling transistor 1213 is electrically connected to the drain region (not shown) of the switching transistor through a drain wiring line (not shown), to be exact. The gate electrode 1218 has a single gate structure but may take a multi-gate structure. The source wiring line 1220 of the current controlling transistor 1213 is connected to a current supplying line (not shown).

The current controlling TFT 1213 is an element for controlling the amount of current supplied to the light emitting element 1222, and a relatively large amount of current flows through this TFT. Therefore, it is preferable to design to the current controlling TFT to have a channel width (W) wider than the channel width of the switching transistor. It is also preferable to design the current controlling TFT to have a rather long channel length (L) in order to avoid excessive current flow in the current controlling TFT 1213. Desirably, the length is set such that the current is 0.5 to 2 $\mu$A (preferably 1 to 1.5 $\mu$A) per pixel.

If the active layer (channel formation region, in particular) of the current controlling transistor 1213 is formed thick (desirably 50 to 100 nm, more desirably 60 to 80 nm), degradation of the transistor can be slowed.

After the current controlling TFT 1213 is formed, the interlayer insulating film 1219 is formed and cathode 1223 that is electrically connected to the current controlling TFT 1213 is formed. In this embodiment, the current controlling transistor 1213, the wiring that connects the cathode 1223 electrically and cathode 1223 are formed at the same time and same material. As the materials of cathode 1223, the conductive film having small working function is preferably used. In this example, the cathode 1223 formed from Mg:Ag.

On the anode 1223, the organic compound layer 1226 is formed to cover the cathode 1223, and the anode 1228 is formed thereof. As material for forming the anode 1228, a transparent conductive film having a transparency is used. In this embodiment, ITO is deposited in 110 nm thick, and the anode 1228 is formed. Not illustrated, a barrier layer can be provided between the organic compound layer 1226 and the anode 1228. As materials for forming a barrier layer, material shown in Embodiment 1 is used.

According to above-mentioned, a light emitting device having reverse stagger TFT can be formed. The light emitting device formed by this embodiment can emit light at the direction indicated by the arrow (upward) shown in FIG. 12B.

A manufacturing steps of the reverse stagger TFT is easier to reduce than that of the top gate TFT. It has an advantages in reduction of manufacturing cost.

In this embodiment, upward emission light emitting device having reverse stagger TFT that emit light from an anode side of the light emitting element. The present invention can be implemented by combining the reverse stagger TFT with downward emission type that emit light from an anode side of the light emitting element and upward emission type that emit light from a cathode side of the light emitting element.

[Embodiment 6]

Being self-luminous, a light emitting device using a light emitting element has better visibility in bright places and wider viewing angle than liquid crystal display devices. Therefore, display devices of various electric appliances can be completed by using the light emitting device of the present invention.

Given as embodiments of an electric appliance that employs a light emitting device manufactured in accordance with the present invention are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording media (specifically, devices with a display device that can reproduce data in a recording medium such as a digital video disk (DVD) to display an image of the data). Wide viewing angle is important particularly for portable information terminals because their screens are often slanted when they are looked at. Therefore it is preferable for portable information terminals to employ the light emitting device using the light emitting element. Specific embodiments of these electric appliance are shown in FIGS. 14A to 14H.

Figure 14A:
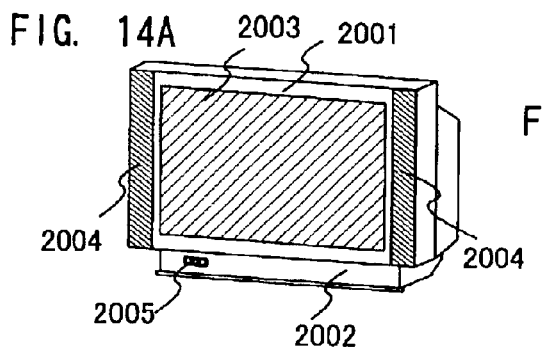
FIGS. 14A to 14H are diagrams showing examples of electronic equipment.

FIG. 14A shows a display device, which is composed of a case 2001, a support base 2002, a display unit 2003, speaker units 2004, a video input terminal 2005, etc. The light emitting device manufactured in accordance with the present invention can be applied to the display unit 2003. Since the light emitting device having the light emitting element is self-luminous, the device does not need back light and can make a thinner display unit than liquid crystal display devices. The display device refers to all display devices for displaying information, including ones for personal computers, for TV broadcasting reception, and for advertisement.

Figure 14B:
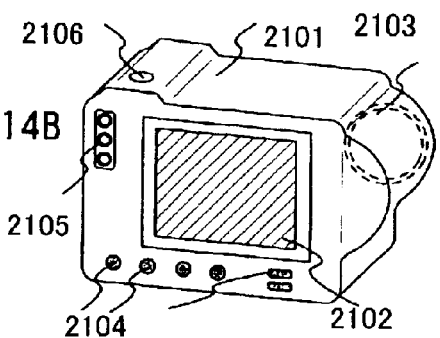

FIG. 14B shows a digital still camera, which is composed of a main body 2101, a display unit 2102, an image receiving unit 2103, operation keys 2104, an external connection port 2105, a shutter 2106, etc. The light emitting device manufactured in accordance with the present invention can be applied to the display unit 2102.

Figure 14C:
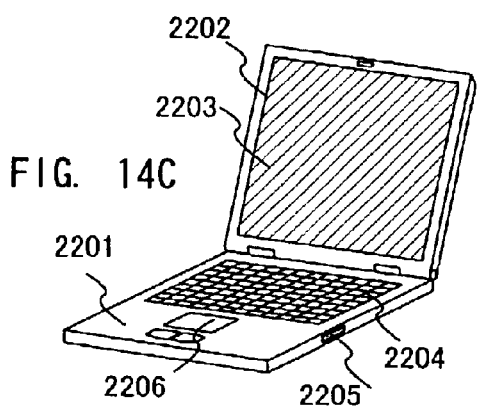

FIG. 14C shows a notebook personal computer, which is composed of a main body 2201, a case 2202, a display unit 2203, a keyboard 2204, an external connection port 2205, a pointing mouse 2206, etc. The light emitting device manufactured in accordance with the present invention can be applied to the display unit 2203.

Figure 14D:
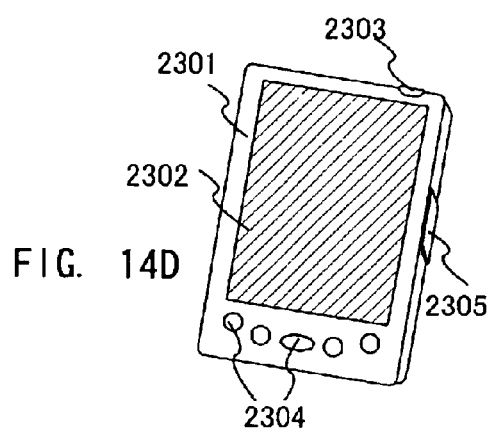

FIG. 14D shows a mobile computer, which is composed of a main body 2301, a display unit 2302, a switch 2303, operation keys 2304, an infrared port 2305, etc. The light emitting device manufactured in accordance with the present invention can be applied to the display unit 2302.

Figure 14E:
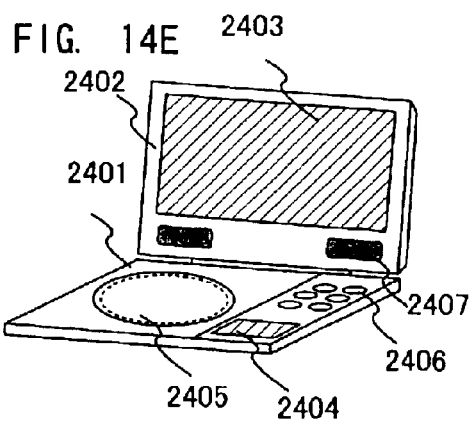

FIG. 14E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The light emitting device manufactured in accordance with the present invention can be applied to the display units A 2403 and B 2404. The image reproducing device equipped with a recording medium also includes home-video game machines.

Figure 14F:
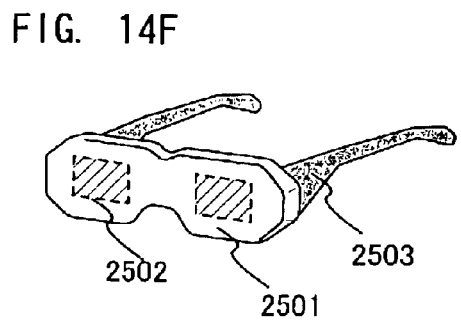

FIG. 14F shows a goggle type display (head mounted display), which is composed of a main body 2501, display units 2502, and arm units 2503. The light emitting device manufactured in accordance with the present invention can be applied to the display units 2502.

Figure 14G:
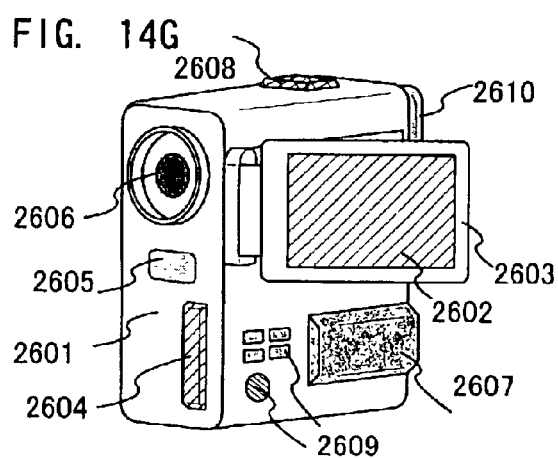

FIG. 14G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The light emitting device manufactured in accordance with the present invention can be applied to the display unit 2602.

Figure 14H:
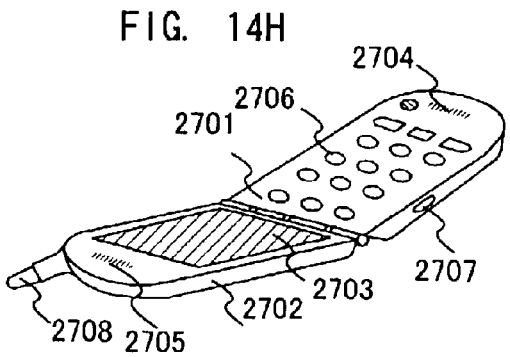

FIG. 14H shows a cellular phone, which is composed of a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703. If the display unit 2703 displays white letters on black background, the cellular phone consumes less power.

If the luminance of light emitted from organic materials is raised in future, the light emitting device can be used in front or rear projectors by enlarging outputted light that contains image information through a lens or the like and projecting the light.

These electric appliances now display with increasing frequency information sent through electronic communication lines such as the Internet and CATV (cable television), especially, animation information. Since organic materials have very fast response speed, the light emitting device is suitable for animation display.

In the light emitting device, light emitting portions consume power and therefore it is preferable to display information in a manner that requires less light emitting portions. When using the light emitting device in display units of portable information terminals, particularly cellular phones and audio reproducing devices that mainly display text information, it is preferable to drive the device such that non-light emitting portions form a background and light emitting portions form text information.

As described above, the application range of the light emitting device manufactured by using the deposition device of the present invention is so wide that it is applicable to electric appliances of any field. The electric appliances of this embodiment can employ as their display units any light emitting device which is formed by implementing Embodiments 1 to 5.

The edge portions of a first electrode of a light emitting element can be covered by an insulating layer in accordance with implementing the present invention, and therefore electric field concentrations from the edge portions of the first electrode to an organic compound layer can be prevented from occurring when applying a voltage to the light emitting element, and deterioration of the organic compound layer which develops following the electric field concentration can be prevented. Further, the insulating layer formed in the present invention is formed such that steps with the first electrode do not develop, and therefore film formation irregularities of the organic compound layer formed on the first electrode can be prevented.

What is claimed is:

1. A method of manufacturing a light-emitting device, comprising:

Forming a thin film transistor over a substrate;

Forming an insulating layer over the thin film transistor;

Forming a wiring over the insulating layer;

Forming a conductor, which is electrically connected to the thin film transistor by the wiring, over the insulating layer, Forming an insulating film over the conductor, Polishing at least an upper portion of the insulating film by a chemical mechanical polishing method until at least an entire upper surface of the conductor is exposed, making an exposed upper surface of the conductor flush with a polished upper surface of the insulating film, where the upper portion of the insulating film covers the entire surface of the conductor, thus forming a first electrode and a leveled insulating layer, Forming an organic compound layer contacting the first electrode; and Forming a second electrode contacting the organic compound layer.

2. A method according to claim 1, wherein the first electrode and the leveled insulating film formed by polishing by a chemical mechanical polishing method have a film thickness of from 50 to 500 nm.

3. A method of manufacturing a light emitting device, comprising:

forming a thin film transistor over a substrate;

forming an insulating layer over the thin film transistor;

forming a wiring over the insulating layer;

forming a conductor, which is electrically connected to the thin film transistor by the wiring, over the insulating layer;

forming an insulating film over the conductor;

polishing at least an upper portion of the insulating film by a chemical mechanical polishing method until at least an entire upper surface of the conductor is exposed, thereby making an exposed upper surface of the conductor flush with a polished upper surface of the insulating film, wherein said upper portion of the insulating film covers the entire surface of the conductor, thus forming a first electrode and a leveled insulating layer;

forming an organic compound layer contacting the first electrode; and forming a second electrode contacting the organic compound layer;

wherein the organic compound layer is formed so as to completely cover the first electrode.

4. A method according to claim 3, wherein the first electrode and the leveled insulating film formed by polishing by a chemical mechanical polishing method have a film thickness of from 50 to 500 nm.

5. A method of manufacturing a light emitting device, comprising:

forming a thin film transistor over a substrate;

forming an insulating layer over the thin film transistor;

forming a wiring over the insulating layer;

forming a conductor, which is electrically connected to the thin film transistor by the wiring, over the insulating layer;

forming an insulating film over the conductor;

polishing at least an upper portion of the insulating film by a chemical mechanical polishing method until at least an entire upper surface of the conductor is exposed, thereby, making an exposed upper surface of the conductor flush with a polished upper surface of the insulating film, wherein said upper portion of the insulating film covers the entire surface of the conductor, thus forming a first electrode and a leveled insulating layer;

forming an organic compound layer contacting the first electrode; and forming a second electrode contacting the organic compound layer, wherein the organic compound layer is formed contacting the first electrode and the leveled insulating layer.

6. A method according to claim 5, wherein the first electrode and the leveled insulating film formed by polishing by a chemical mechanical polishing method have a film thickness of from 50 to 500 nm.

7. A method of manufacturing a light-emitting device, comprising:

Forming a thin film transistor over a substrate;

Forming an insulating layer over the thin film transistor,

Forming a wiring over the insulating layer;

Forming a conductor, which is electrically connected to the thin film transistor by the wiring, over the insulating layer, Forming an insulating film over the conductor;

Polishing at least an upper portion of the insulating film by a chemical mechanical polishing method until at least an entire upper surface of the conductor is exposed, making an exposed upper surface of the conductor flush with a polished upper surface of the insulating film, where the upper portion of the insulating film covers the entire surface of the conductor, thus forming a first electrode and a leveled insulating layer;

Forming an organic compound layer contacting the first electrode; and

Forming a second electrode contacting the organic compound layer.

8. A method according to claim 7, wherein the first electrode comprises a material selected from the group consisting of aluminum, titanium, and tungsten.

9. A method according to claim 7, wherein the first electrode is formed by laminating a material belonging to one of Group I and Group II of the periodic table and a material having conductivity.

10. A method according to claim 7, wherein the leveled insulating film is formed by at least one of silicon oxide, silicon oxynitride, and silicon nitride.

11. A method according to claim 7, wherein the leveled insulating film is formed by at least one of polyimide, polyamide, acrylic and benzocyclobutene.

12. A method of manufacturing a light-emitting device, comprising:

Forming a thin film transistor over a substrate;

Forming an insulating layer over the thin film transistor;

Forming a wiring over the insulating layer,

Forming a conductor, which is electrically connected to the thin film transistor by the wiring, over the insulating layer, Forming an insulating film over the conductor, Leveling the conductor and the insulating film, thus forming a first electrode and a leveled insulating film;

Polishing at least an upper portion of the insulating film by a chemical mechanical polishing method until at least an entire upper surface of the conductor is exposed, making an exposed upper surface of the conductor flush with a polished upper surface of the insulating film, where the upper portion of the insulating film covers the entire surface of the conductor, thus forming a first electrode and a leveled insulating layer;

Forming an organic compound layer contacting the first electrode; and

Forming a second electrode contacting the organic compound layer.

13. A method according to claim 12, wherein the first electrode comprises a material selected from the group consisting of aluminum, titanium, and tungsten.

14. A method according to claim 12, wherein the first electrode is formed by laminating a material belonging to one of Group 1 and Group 2 of the periodic table and a material having conductivity.

15. A method according to claim 12, wherein the leveled insulating film is formed by at least one of silicon oxide, silicon oxynitride, and silicon nitride.

16. A method according to claim 12, wherein the leveled insulating film is formed by at least one of polyamide, acrylic and benzocyclobutene.

* * * * *